United States Patent [19]
Blumenkrantz et al.

[11] Patent Number: 5,541,600
[45] Date of Patent: Jul. 30, 1996

[54] SIGNAL PROCESSING CIRCUIT INCLUDING A VARIABLE GAIN INPUT STAGE

[75] Inventors: Enrique M. Blumenkrantz, Neuchâtel; Olivier Nys, Peseux, both of Switzerland

[73] Assignee: CSEM Centre Suisse d'Electronique et de Microtechnique SA–Recherche et Developpement, Neuchatel, Switzerland

[21] Appl. No.: 264,645

[22] Filed: Jun. 23, 1994

[30] Foreign Application Priority Data

Jun. 28, 1993 [FR] France ................................ 93 07950
Mar. 25, 1994 [FR] France ................................ 94 03541

[51] Int. Cl.⁶ ........................................... H03M 1/18
[52] U.S. Cl. ............................................ 341/139
[58] Field of Search ................................ 341/139, 144, 341/155, 118

[56] References Cited

U.S. PATENT DOCUMENTS

| | | | |
|---|---|---|---|
| 3,921,012 | 11/1975 | Marshall, III ........................ | 307/271 |
| 4,075,701 | 2/1978 | Hofmann .............................. | 364/579 |
| 4,185,246 | 1/1980 | Schroeder ............................ | 328/165 |
| 4,851,841 | 7/1989 | Sooch .................................. | 341/143 |
| 5,134,401 | 7/1992 | McCartney et al. ................ | 341/143 |
| 5,144,311 | 9/1992 | Buhler et al. ....................... | 341/166 |
| 5,187,482 | 2/1993 | Tiemann et al. .................... | 341/143 |

FOREIGN PATENT DOCUMENTS 0338837 10/1989 European Pat. Off. ..

*Primary Examiner*—Brian K. Young
*Attorney, Agent, or Firm*—Griffin, Butler Whisenhunt & Kurtossy

[57] ABSTRACT

The invention concerns a processing circuit (2, 120) for producing a variable output signal in response to a variable quantity picked up or received as input. The processing circuit is associated with a stage or has an input sensor (4, 100) furnishing a signal with a variable amplification/attenuation factor, and further exhibits response characteristics which depend in particular from state variables. The processing circuit includes a suppression circuit (FIG. 5, FIG. 6) for suppressing transients normally produced by modification of the amplification/attenuation factor, this suppression circuit functioning by modifying the value of the state variables in direct proportion to the modification of the amplification/attenuation factor.

33 Claims, 11 Drawing Sheets

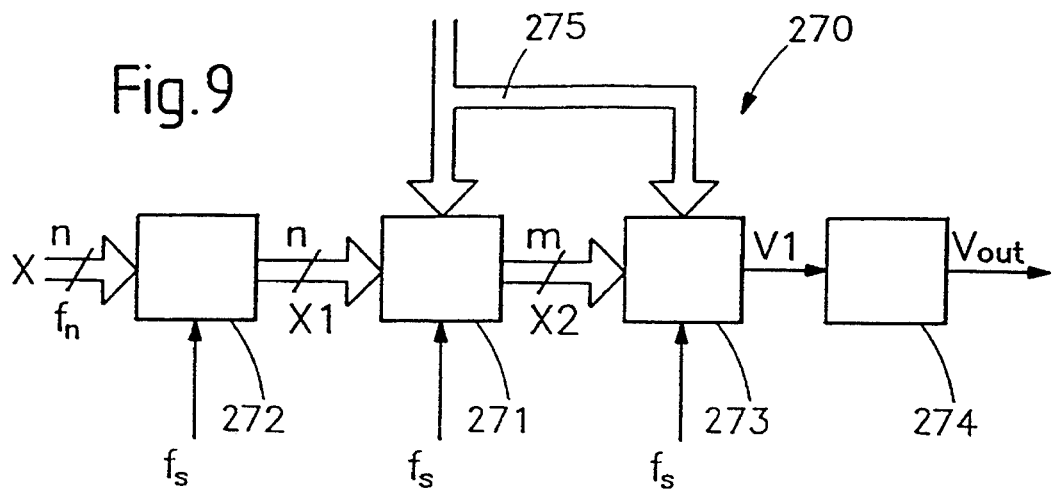
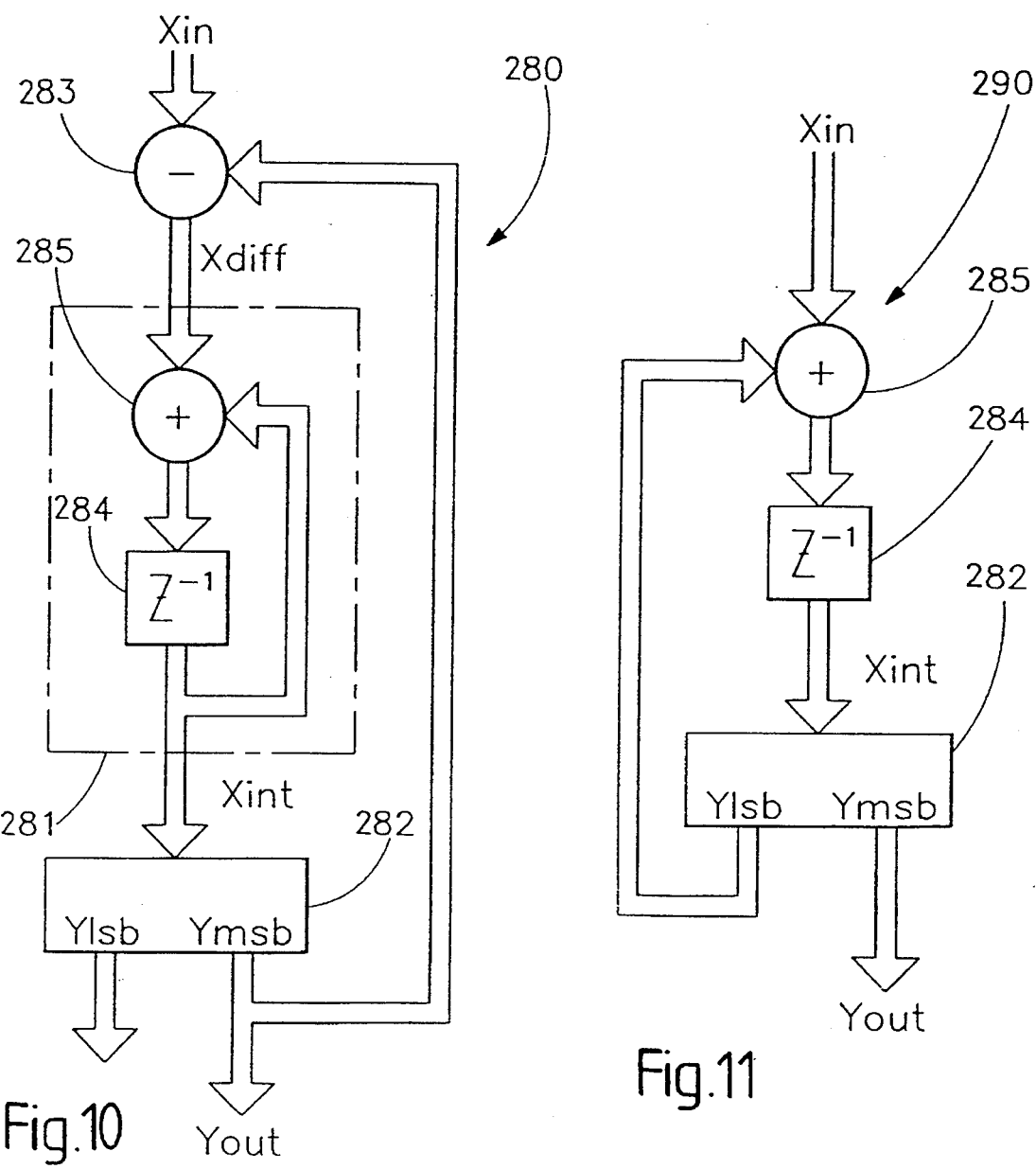

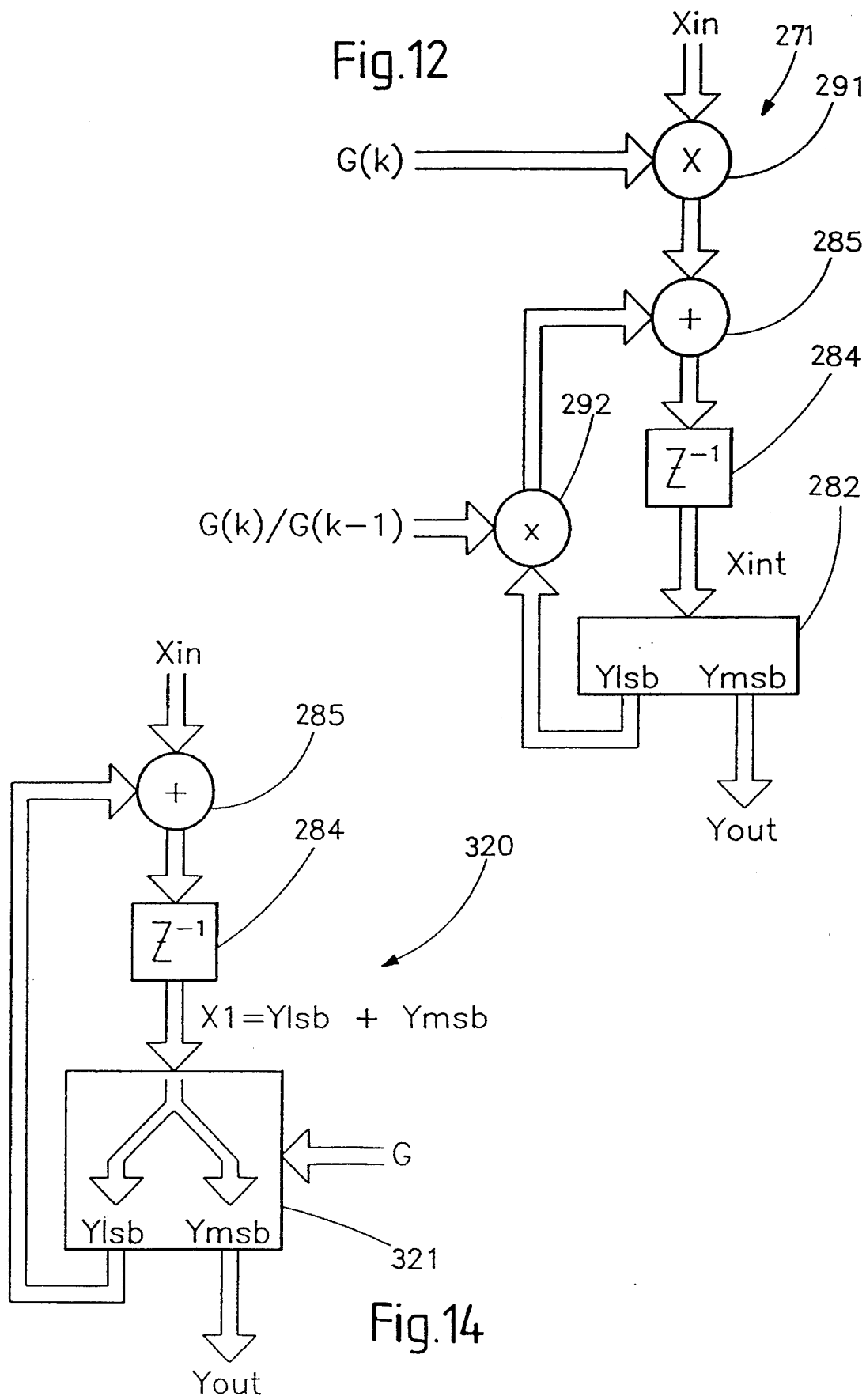

SIGNAL PROCESSING CIRCUIT INCLUDING A VARIABLE GAIN INPUT STAGE

The present invention very generally concerns processing circuits provided for producing a variable output signal in response to a variable quantity which is picked up or received as input. The present invention more specifically concerns processing circuits which are associated with a stage or an input sensor furnishing a signal with a variable amplification/attenuation factor and in particular it concerns circuits for processing signals upstream of the input of which is placed a variable gain circuit.

It is well known to provide a switchable gain, or more generally, variable gain element upstream of a circuit for processing a signal. Everyone is acquainted in particular with the example of voltmeters with range switching. In a general manner, recourse is normally had to such an association between a switchable gain element and a circuit for processing a signal when one wishes to assure a constant signal/noise ratio over a more extended range than the dynamic range inherent to the processing circuit.

The utilization of a switchable gain stage upstream of a signal processing circuit can exhibit drawbacks. In effect, with numerous types of circuits, each switching of the range of sensitivity brings about the appearance of undesirable values or transient states (hereafter designated as transients) in the signal furnished as output. Such transients coupled with a change of range appear systematically as soon as a given circuit comprises components such as capacitors or windings which by their nature accumulate "recollections" of prior states of the circuit. In such conditions, one speaks of circuits having a memory, of circuits depending from state variables or again of circuits the transfer characteristics of which depend from state variables.

It will be understood that with circuits the transfer characteristics of which depend from state variables or in other words with the circuits having a memory, recourse to range switching is possible only if the time to become stabilized is given to the circuit, after each change of range, before using the signal which it furnishes as output.

Analog circuits having a memory are very current. Effectively, most current analog filters include inductive or capacitive components which retain the memory of prior states. On the other hand, most precise analog circuits as, for example, sigma-delta converters or phase or frequency lock-in systems are based on a compromise between, on the one hand, precision in forming their different components and, on the other hand, their reaction times or their pass band.

In lock-in amplifiers, in particular, advantage is taken of the known periodicity of a signal in order to bring about its detection in an extremely limited band width in a manner to distinguish it from the ambient noise. In sigma-delta modulators, on the other hand, a certain tolerance as to the precision of manufacture is compensated by recourse to oversampling and to a quantified retroaction which takes into account the errors passed up to a certain order.

In order to permit a better definition of the object of the present invention, it is useful to better characterize the transfer characteristic and the functional properties of circuits having a memory.

The functional characteristics of an analog processing circuit without a memory can be described in the form of an arbitrary but established combination (possibly very complex) with constant coefficients and quantizers. This transfer characteristic is then determined and the output signal of the circuit at a given instant is thus entirely determined by knowledge of the instantaneous signal on the input.

In the case of an analog circuit having a memory on the other hand, the value of the output circuit does not solely depend from the input signal at a specific instant, but also from the input signal at a other instants prior to such particular instant. It can be said that in the case of a circuit element having a memory, the recollections of the circuit influence its transfer characteristics. In other words, in the case of a circuit element having a memory, the combination of coefficients and quantizers which permit determination of the value of the output signal from the value of the input signal at a given instant is a function of the value of the input signal at prior instants. A circuit element having a memory will thus generally be characterized, from the functional viewpoint, by a combination comprising constant coefficients and quantizers but to which are added, this time, variable elements which retain the memory of the prior instants and are called state variables. Let us note in particular that in the case of analog filters there are as many state variables as poles.

It can thus be said that the memory of a circuit element is stored in state variables. In a real circuit, the elements which store such memory are the capacitors and inductances. The state variables of a circuit will thus be defined by the voltages at the capacitor terminals, currents in the windings or a combination of both. It will furthermore be noted that every capacity and every inductance placed in the path of the signal constitutes a form of integrator and that consequently it can be said that the memory of a circuit element is stored in integrators.

A specific example of a circuit having such a memory is, as we have already said, a sigma-delta converter.

In order to explain the basic principles of operation of a sigma-delta converter, reference will be made to FIG. 1, which shows a first order sigma-delta analog/digital converter 201 having an integrator 202, a comparator 203, a one-bit digital/analog converter 204, a digital low pass filter 205 and a signal combining unit 206. The A/D converter 1 in addition has an input terminal 207, an output terminal 208 and a data terminal 209.

An analog input signal is applied to the input terminal 207 and supplied via the signal combining unit 206 to the integrator 202. The comparator 203 samples the signal from the integrator 202 at a sampling frequency $f_s$, which is N times higher than the Nyquist frequency $f_N$ (twice the highest signal frequency). N is called the oversampling factor. At the output of the comparator 203, coarse (1 bit) estimations of the analog input signal become available at the oversampling rate. These estimations, available as a bit stream from the data terminal 209, are converted into analog form by the D/A converter 204 and subtracted from the analog input signal by the signal combining unit 206. The bit stream from the output of the comparator 203 contains information composed of the analog input value, in digital form, as well as a digital error signal, otherwise known as quantisation error or quantisation noise.

In order to analyse the information in the bit stream, the converter 201 can be modelled as a linear system, where the comparator output can be linearised as $y(t)=cx(t)+r(t)$, where $x(t)$ is the comparator input, $y(t)$ is its output and $c$ is the linearised comparator gain. The quantisation error or noise, $r(t)$, represents the error between the linear model and the originally non-linear transfer. The output of the converter from the data terminal 209 can be expressed in terms of $I(s)$ and $G(s)$, which are the frequency domain representations of the input signal $i(t)$ applied to the terminal 207 and the integrator transfer function $g(t)$, and also $R(s)$, the spectral density of the quantisation error $r(t)$:

$$Y(s) = [{}^{cG(s)}/_{(1+cG(s))}] \cdot I(s) + [{}^{1}/_{(1+cG(s))}] \cdot R(s)$$

From this equation, it can be seen that the use of a transfer function G(s) representing an integrator or first order low pass filter, enables the quantisation error in the low frequency components of the bit stream Y(s) to be minimized. In this case, for frequencies in the base band, Y(s) can be approximated by:

$$Y(s) = I(s) + 1/_{(1+cG(s))} \cdot R(s)$$

Accordingly, I(s) is not distorted, and the quantisation noise R(s) is transferred by a high-pass filter $1/_{(1+cG(s))}$, realising a maximum attenuation of the quantisation error for baseband frequencies, and a gradually decreasing attenuation for frequencies beyond the baseband. This effect is called "noise shaping". The higher frequency errors in the bit stream are suppressed by the digital low-pass filter 205. Further, the dynamic range of the sigma-delta converter 201 may be improved by substituting a second or higher order integrator, or a second or higher order low-pass filter, or cascading two or more such integrators or filters, in place of the integrator 202 shown in FIG. 1.

A multi-range signal converter is a converter possessing two or more input ranges, each range being defined by the maximum value of the input signal capable of being admitted by the converter. Such a converter is generally shown in FIG. 2 by an analog/digital converter 210 having a classic A/D converter block 211, signal combining units 212 and 213, and an inverting block 214. An analog signal $V_{in}$ is amplified by a gain G at the signal combining unit 212. The amplified signal $G*V_{in}$ is converted into a digital output signal B by the A/D block 211. The output signal B is subsequently amplified by the inverse of the gain G at the signal combining unit 213, thus producing at its output a digital signal B/G, representative of the analog input signal $V_{in}$.

The different ranges of the converter 210 correspond to different values of the gain G which may be chosen, each range having the same number of quantification steps (this number being determined by the conversion algorithm of the A/D block 211). Because of this, the size of the quantification step in the different ranges is directly proportional to the maximum value of the input signal. Thus, the low resolution ranges will allow the conversion of signals with the largest amplitudes but with a larger quantisation step, whereas the high resolution ranges will allow the quantification of smaller amplitude signals but with a finer step.

The precision and linearity of direct or binary weighted converters are fundamentally limited by the matching tolerance of its weighted components, such as its transistors, resistances and capacitances. For this reason, integrated direct A/D converters will not obtain a precision better than 1000 to 250 ppm, or in other words, a digital resolution of 10 to 12 bits.

Indirect or interpolative converters, however, have a relative precision which, because of their interpolating operation in time, are not limited by the matching tolerances of components. Accordingly, 16 bit resolution sigma-delta converters are often used in applications where resolution and relative precision are important considerations.

However, sigma-delta converters are circuits having a memory, and for this reason are not currently used in applications requiring a signal converter with multiple input ranges. More precisely, when the range of the input signal is changed in a sigma-delta converter, additional noise is found in its output signal. This noise, which shall be called commutation noise, results from the fact that in performing its integration function, the integrator 202 of the sigma-delta converter 201 accumulates the quantification error between the input signal and the output signal. If a sigma-delta converter was to be used in an existing multi-ranging converter, this accumulated quantification error would be multiplied by the gain G of the range in use. If the range of the converter, and hence the value of G, were changed, the significance of the integrator would change, but not its contents.

However, the fact that the contents of the integrator do not change would cause an inconsistency in the integration process, resulting in the appearance of commutation noise in the bit stream produced by the integrator.

A purpose of the present invention is thus to provide a circuit, the transfer characteristic of which depends from the state variables which is capable of functioning in association with a variable gain circuit without its signal being disturbed by transients following each change of said variable gain.

The present invention attains this purpose in providing a processing circuit for producing a variable output signal in response to a variable quantity picked up or received as input, said processing circuit being associated with a stage or having an input sensor furnishing a signal with a variable amplification/attenuation factor and said processing circuit further exhibiting response characteristics which depend in particular from state variables, characterized in that it includes means for suppressing transients normally produced by modification of said amplification/attenuation factor, said means for suppressing transients functioning by modifying the value of said state variables in direct proportion to said modification of the amplification/attenuation factor.

Thanks to the above means for suppressing transients, the amplification/attenuation factor can be made to vary without provoking transients. Additionally, thanks to such variable amplification/attenuation factor, it is possible to obtain circuits the functional range of which is always close to the optimum concerning the signal/noise ratio as well as the energy consumption and this whatever be the intensity of the quantity picked up or received as input.

An advantageous variant of the present invention provides a processing circuit constituting a sigma-delta converter for converting a variable input signal into a variable output signal, comprising signal combining means for adding or subtracting said output signal from said input signal so as to produce a combined signal, integrating means for integrating said combined signal so as to produce an integrated signal, said integrating means having error storage means for storing a quantity representative of the temporal value of said combined signal, comparator means for comparing said integrated signal to one or more pre-defined levels so as to produce said output signal, feedback means for supplying a feedback signal representative of said output signal to said combining means, means for amplifying said input signal by a desired gain, range setting means for altering said amplification/attenuation factor between a first value and at least a second value, means to amplify said output signal by the inverse of said amplification/attenuation factor, and noise compensation means for multiplying said stored quantity by the ratio of said second value to said first value when said amplification/attenuation factor is changed from said first value to said second value.

By multiplying the quantification error stored in the integrator by the ratio of the new gain to the old gain when input range of the converter is changed, the inconsistency in the integration process, which would otherwise result in the appearance of commutation noise, is avoided.

Another aspect of the present invention provides a processing circuit constituting a sigma-delta converter for converting a variable input signal into a variable output signal, comprising signal combining means for adding or subtracting a feedback signal representative of said output signal from said input signal so as to produce a combined signal, integrating means for integrating said combined signal so as to produce an integrated signal, said integrating means having error storage means for storing a quantity representative of the temporal value of said combined signal, comparator means for comparing said integrated signal to one or more pre-defined levels so as to produce said output signal, feedback means for supplying a feedback signal representative of said output signal to said signal combining means, means to amplify said output signal by an amplification/attenuation factor so as to provide said feedback signal, and range setting means for altering said amplification/attenuation factor between a first value and at least a second value.

As the quantification error accumulated in the integrator is independant of the gain of the particular range selected, the introduction of commutation noise into the output signal of the sigma-delta converter is therefore avoided.

Other characteristics and advantages of the present invention will appear upon reading the detailed description which follows, given solely by way of example and prepared with reference to the attached drawings, in which:

FIG. 1, already described, shows a schematic block diagram of an existing sigma-delta converter;

FIG. 2, already described, shows a schematic block diagram of an existing multi-range converter;

FIG. 9 is a schematic block diagram of an open-loop oversampled digital/analog converter having multiple input ranges;

FIG. 10 is a schematic diagram of a sigma-delta converter for converting a digital signal of n bits to a digital signal of m bits;

FIG. 11 is a simplified schematic diagram of the sigma-delta converter of FIG. 10;

FIG. 12 is schematic diagram of a sigma-delta converter according to the present invention for use in the digital/analog converter of FIG. 9;

FIG. 14 is a schematic diagram of another sigma-delta converter for converting a digital signal of n bits to a digital signal of m bits according to the present invention;

Figure 3:
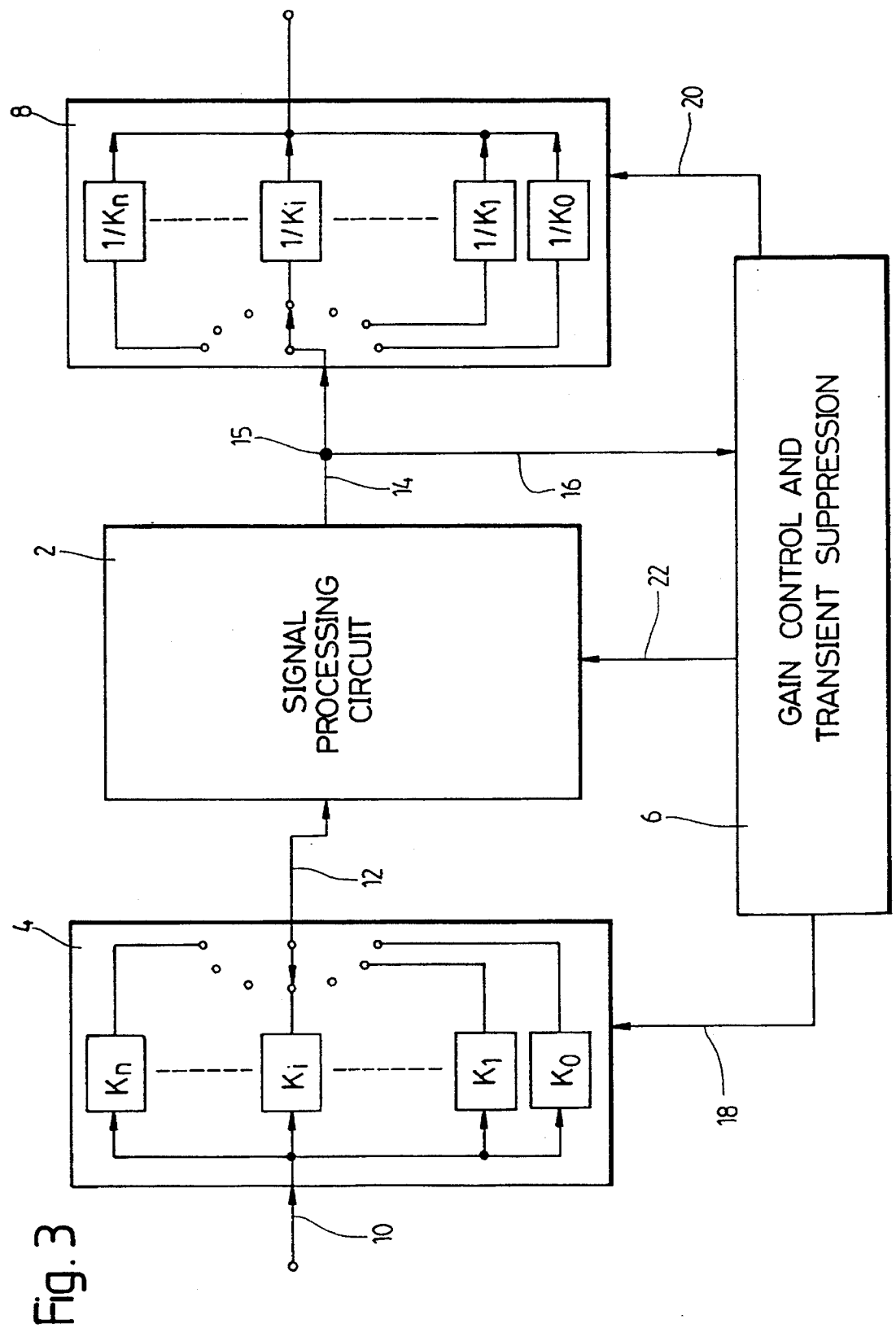
FIG. 3 is the basic schematic of an analog signal processing circuit according to the present invention associated with an input stage having variable gain (or amplification/attenuation factor)

FIG. 3 is the schematic of the principle of an analog circuit according to the present invention. FIG. 3 basically includes four blocks which respectively symbolize a circuit for processing a signal 2, a first variable gain stage 4 of amplification/attenuation, a block 6 amalgamating gain control means and transient suppression means and finally a second variable gain stage 8 of amplification/attenuation in order to restore the signal to its original level. It is fitting to note that in certain applications block 8 can be implicit. In the case of a multimeter, for example, it is the operator who determines the measurement scale to be considered in knowing the position of the range selector.

The general principle of operation is the following. The signal to be processed is initially supplied by a line 10 at the input of the first amplification/attenuation stage 4 which, in response to such signal, furnishes as output on a line 12 a signal the amplitude of which is standardized. The amplification/attenuation stage 4 is foreseen to be controlled by gain control means. On FIG. 3, the different values which the gain can assume are noted $K_0, K_1, \ldots K_n$. As will be seen further on, the gain can assume either a set of discrete values (it is then spoken of as a switchable gain), or vary continuously over a certain interval.

The signal amplified by the amplification/attenuation stage is furnished via line 12 to the input of the signal processing circuit 2. In response to this signal on its input, circuit 2 furnishes as output a processed signal on line 14. The processing applied to this signal can be of all known types (filtering, analysis, analog/digital conversion, etc.).

Further to be seen on FIG. 3 is a line 16 extending between a node 15 on line 14 and block 6. Such line 16 serves to apply the level of the signal furnished as output from the processing circuit 2 to the gain control means of block 6 in a manner to permit such latter to determine at which moment the gain from stage 4 must be changed. The person skilled in the art will understand that in place of controlling the level of the output signal from the processing circuit 2, it would be also possible to measure the level of the signal as input, of the signal as output from the first stage 4 or at any other place on the schematic of FIG. 3.

In the example of FIG. 3, the principle of operation of the gain control means 6 is as follows: if at a given moment the signal level on line 16 exceeds a certain fraction, for example 90% of the dynamic total of circuit 2 or if, on the contrary, such level falls below a certain fraction, for example 25% of the dynamic, the gain control means react by controlling the two amplification/attenuation stages 4 and 8 in a manner to change their gain so as to bring back the signal level at the input of the processing circuit 2 to a value as close as possible to the maximum admissible by such latter.

To this effect, there is further seen in FIG. 3 two lines 18 and 20 coupling the gain control means 6 to the two amplification/attenuation stages 4 and 8. The two lines 18 and 20 are intended each to furnish a control signal to stages 4 and 8 in response to which each of stages 4 and 8 will change its gain. The gain control means and the amplification/attenuation stages are provided so as to cooperate in a manner in which when the gain of the first stage 4 changes in a given ratio, the gain of the second stage 8 changes in a ratio inverse to that of the first stage. Such an arrangement is important when for example the signal to be processed is an audio-signal which it is desired to filter. Nevertheless, as has already been said, the second amplification/attenuation stage 8 can be not explicity present as in the measuring instrument already mentioned.

The elements of FIG. 3, the operation of which has been described up to here, are known to the person skilled in the art and can be formed in accordance with a large number of variants, and the field of application of the transient suppression means according to the present invention which are now to be described are absolutely not limited to the specific variant shown on FIG. 3.

In the absence of suppression means of the transients according to the present invention, if the signal processing circuit 2 has a memory, its operation is disturbed each time that the gain of the amplification stage is modified. Any switching of the gain produces transients in the output signal which render such latter unusable until circuit 2 becomes stabilized. In the case in which the gain of the first stage 4 varies progressively, the transients as such will not be observed in the output signal, but such signal nevertheless contains an undesirable component produced by the gain variations of the first stage 4.

In order to remedy such factual state, module 6 of FIG. 3 further comprises, according to the present invention, a sequencer which is associated with the gain control means and which assures, via line 22, the control of the means for suppressing transients according to the present invention. Such transient suppression means will be described in more detail further on in relationship with FIGS. 5 and 6.

As has already been said in the introduction to this description, the transient suppression means are provided so as to modify the values of the state variables of the processing circuit 2 each time that the gain of the amplification/attenuation stage 4 changes. Furthermore, the modification of the state variables is accomplished in proportion to the gain variation of the first stage 4. Experience shows in effect that such modification of the state variables enables the bringing about of an almost total disappearance of the transients and the undesirable components in the output signal of the processing circuit 2.

Although the principle of the present invention has already been set forth hereinabove, we have not, up to here, described the exact operation which enables the transient suppression means to modify in a sufficient manner the values of the state variables of the processing circuit 2. Effectively, the particular form in which the transient suppression means is obtained depends from the specific nature of the processing circuit 2. We are now going to describe, in referring to two specific circuit examples including a memory, two special embodiments of the transient suppression means according to the present invention.

Figure 4:
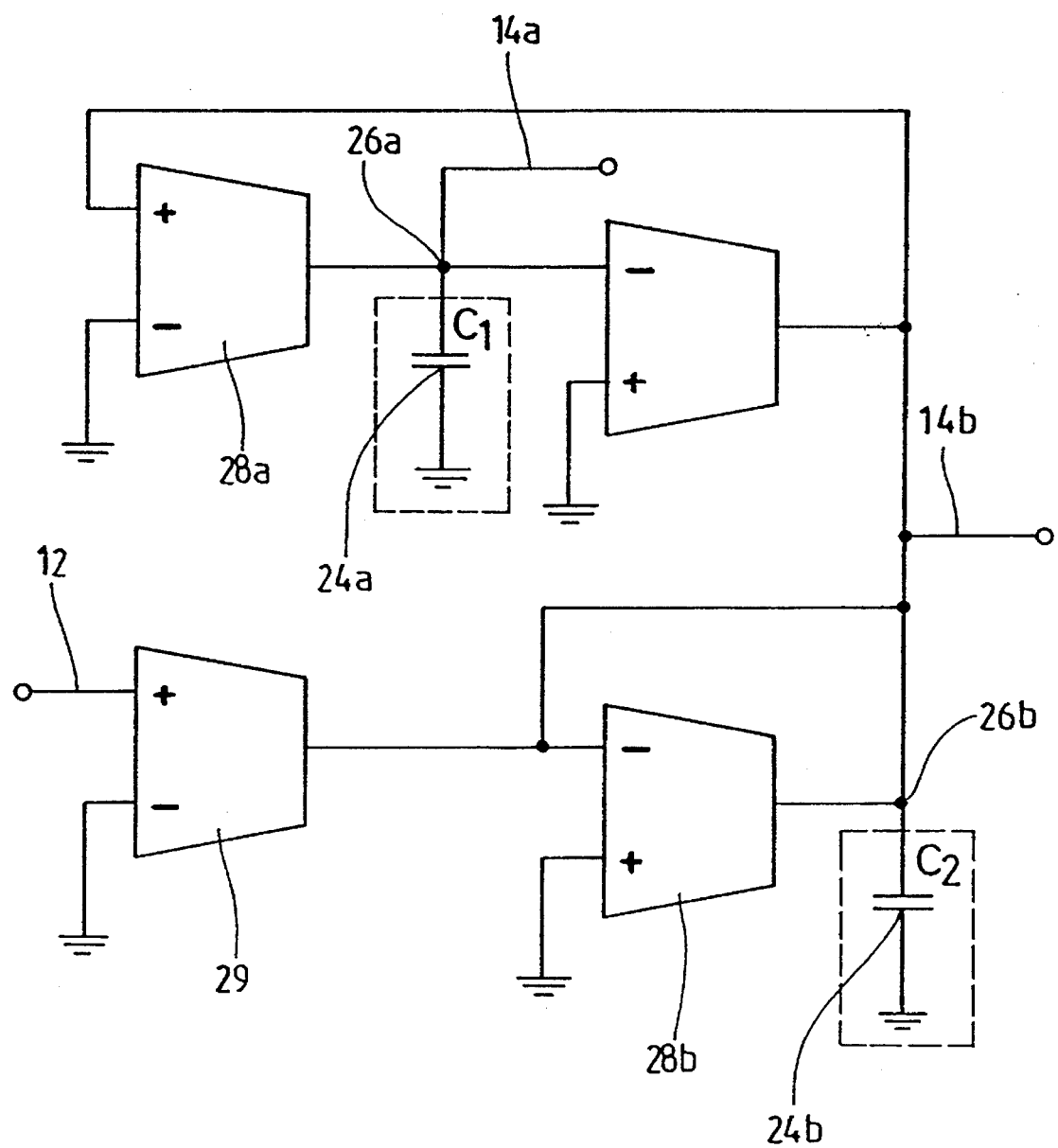
FIG. 4 is the schematic of a continuous second order band-pass/low-pass filter which constitutes an example of a processing circuit according to the present invention.

The circuit shown schematically on FIG. 4 constitutes a first specific circuit example as generally depicted in FIG. 3 by the block referenced 2 for processing a signal. The schematic of FIG. 4 represents a continuous band-pass/low-pass filter of the second order using operational transconductance amplifiers and capacities (OTA-C). Such type of filter is known to the person skilled in the art. Effectively, it is widely used for signal processing in integrated analog forms.

The circuit of FIG. 4 includes an input line 12 for receiving a signal to be filtered furnished by the first amplification/attenuation stage (FIG. 3) and two output lines 14a and 14b intended to be used alternatively to furnish either a low-pass filtered signal or a band-pass filtered signal.

It is seen in FIG. 4 that circuit 2 comprises two capacitors of capacity C1 and C2 respectively referenced 24a and 24b. Such capacitors 24a and 24b are each connected between a node of the circuit (respectively referenced 26a and 26b) and earth. As is seen in this figure, nodes 26a and 26b are each located below a transconductance amplifier (referenced respectively 28a and 28b). It will be understood from the introduction to the description that in the circuit shown here, these are the capacitors 26a and 26b which store the circuit memory. Consequently, in the present example, the state variables which must, in conformity with the present invention, be modified by transient suppression means, are the respective charges on the two above-mentioned capacitors.

Figure 5:
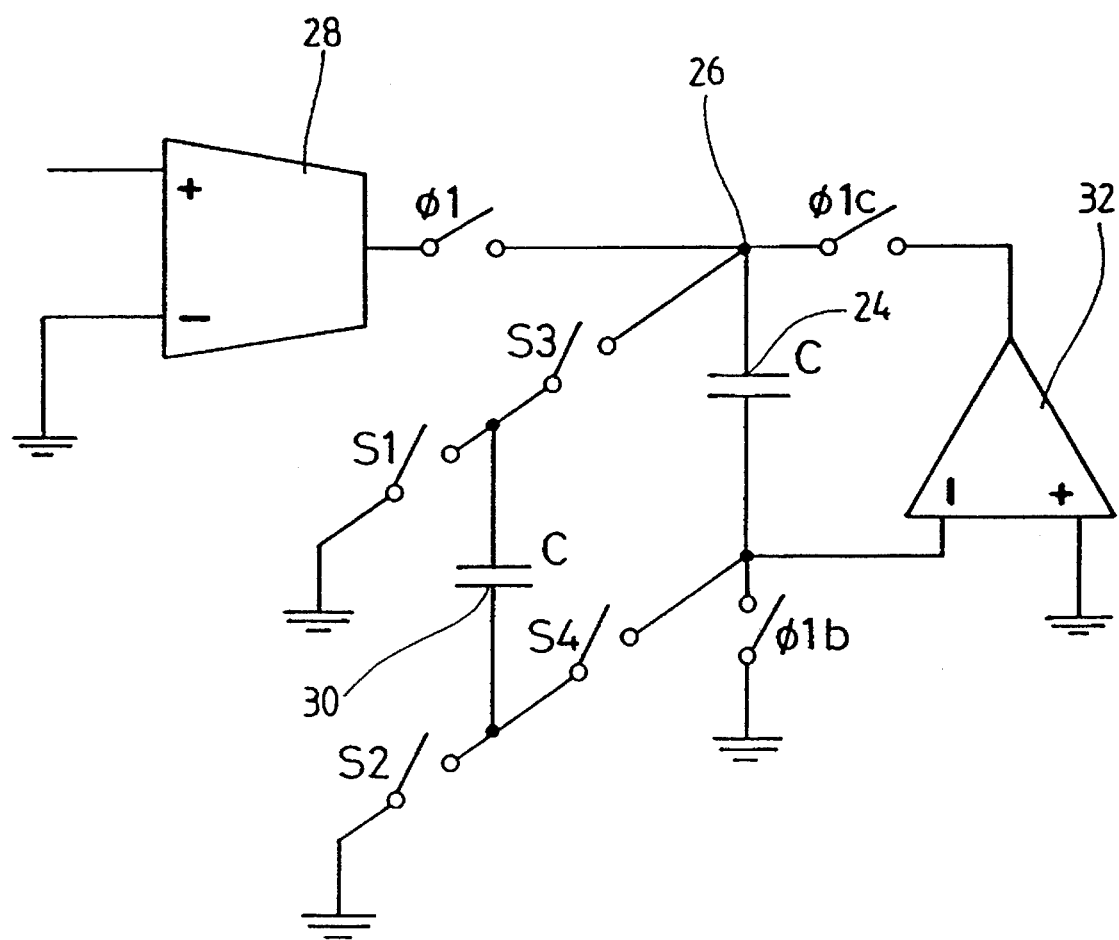
FIG. 5 shows the transient suppression means which according to a first specific embodiment of the present invention are associated with one of two filter capacitors of FIG. 4.

FIG. 5 shows one of the capacitors 24a or 24b of FIG. 4 with the transient suppression means which, according to the present invention, are associated therewith.

The elements of FIG. 5, which were already shown in FIG. 4, keep the same reference numbers. More specifically, capacitor 24 with a capacity C represents one of the capacitors 24a or 24b, the node 26 represents one of the nodes 26a or 26b and the transconductance amplifier 28 represents one of the transconductance amplifiers 28a or 28b.

The other elements shown in FIG. 5 form part of the transient suppression means according to the present invention. The specific transient suppression means described in this first example are provided for a situation in which the amplitude of the signal on the circuit input of FIG. 4 has previously been standardized by an amplification/attenuation stage, the gain of which can assume different discrete values having among them ratios which are powers of 2. In the present example, such means include a capacitor 30 having the same capacity C as the capacitor 24, an operational amplifier 32 and seven switches respectively referenced φ1, φ1b, φ1c, S1, S2, S3 and S4.

As will be recognized by the person skilled in the art, the assembly described in FIG. 5 is an assembly of the switched capacitor type. The switches can be controlled by control signals generated in a known manner by a sequencer (already mentioned in relationship to FIG. 3) itself responding to control signals produced by the gain control means (referenced 6 in FIG. 3). The control signals generated by the sequencer are furnished to the different switches by transmission lines, not shown.

The transient suppression means are thus provided so as to modify the values of the state variables by any power whatsoever of 2. We are going to describe initially the sequence of switching which permits to divide the voltage between the terminals of capacitor 24 by 2. In order to divide the voltage between the terminals of capacitor 24 by a power of 2 greater than one, it is sufficient to repeat the division by 2 procedure as many times as necessary.

When the transient suppression means according to the present invention are inactive or in other words when the gain of the amplification/attenuation stage situated above the filter does not change, switches φ1 and φ1b are closed, while all the other switches are open.

At the instant when the gain control means send a control signal in order to reduce the gain by a factor of 2, the sequencer controlling the transient suppression means becomes operative. It generates initially a first control signal in order to open the switches φ1 and φ1b and to close the switch φ1c and the switches S1 and S2. The first result of such switching is to isolate the first capacitor 24 and its contents from the remainder of the circuit. Additionally, closing the switch φ1c has as effect to connect the capacitor 24 between the output and the virtual ground of amplifier 32 in a manner such that its charge is maintained constant in a first time. Finally, closing switches S1 and S2 has as effect to completely discharge the second capacitor 30.

Next, the sequencer sends a second control signal in order to open switches φ1c, S1 and S2 and to close switches S3 and S4 in a manner to connect the two capacitors 24 and 30 in parallel. Under such conditions, half the charge present in capacitor 24 passes into capacitor 30 in order to equalize the voltages between the terminals of the two capacitors. Such charge transfer has as effect to divide by two the value of the state variable stored in capacitor 24. Finally, the sequencer sends a third control signal in order to reset the switches into their initial configuration (all switches open except φ1 and φ1b).

We are now going to describe the sequence of switching used in order to double the voltage between the terminals of capacitor 24. As we have already said, in the absence of a change of gain, the switches φ1 and φ1b are closed and all the other switches are open.

At the instant when the gain control means send a control signal in order to increase the gain by a factor of 2, the sequencer controlling the transient suppression means becomes operative. It generates initially a first control signal identical to the first control signal of the division by 2 sequence described hereinabove. Such control signal has as effect to open the switches φ1 and φ1b and to close the switch φ1c. As we have already said, the first result of such switching is to isolate capacitor 24 and its contents from the remainder of the circuit. Additionally, closing switch φ1c connects capacitor 24 between the output and the virtual ground of the amplifier 32 in a manner such that its charge is maintained constant during a first time.

Next, the sequencer sends a second control signal in order to close switches S2 and S3. In such conditions, the operational amplifier 32 charges capacitor 30 until the voltage between its terminals is equal to the voltage between the terminals of capacitor 24. The capacity of capacitor 30 being identical to that of capacitor 24, it will contain the same charge as such latter.

Next, the sequencer sends a third control signal in order to open switches S2 and S3 and to cloase switches S1 and S4. Under these conditions, the charges contained in capacitor 30 provoke a modification of the potential at the level of the inverting input of amplifier 32 which, in response thereto, furnishes charges to capacitor 24 until the potential of its inverting input is again that of earth. This latter operation results in doubling the voltage between the terminals of capacitor 24. The sequencer finally sends a fourth control signal in order to reset the switches into their initial configuration (all switches open except φ1 and φ1b).

As can be readily understood, in cases in which, as in the example of the circuit which has just been described, the state variables to be modified are the voltages between the terminals of capacitors, it is possible to have recourse to a capacity switching technique. When recourse is had to such a technique, the operation of the transient suppression means according to the invention can be summarized as follows:

- at the instant at which a change of range comes about, disconnect all the components having a memory from the remainder of the circuit;
- next, change in an appropriate manner the value of the state variables and next,
- finally, once the gain change at the input of the circuit is accomplished, reconnect the components having memories into the remainder of the circuit.

A switching sequence as it has just been enunciated can be effected in a much shorter time than the duration of the transient disturbances which are observed in the absence of transient suppression means according to the invention. In the very frequent cases in which the passband of the processing circuit is sufficiently limited upwards, the cut-off produced in the signal by the transient suppression means will possibly even be imperceptible. In the special case in which the signal to be processed appears under the form of a carrier modulation, the change in the state variables can be brought about at the interior of one or several periods of the carrier.

The embodiment described hereinabove is limited to modifications of the value of a state variable by a power of 2. There is now to be described an embodiment of transient suppression means according to the present invention, also adapted to be used with the circuit of FIG. 4, but enabling changing the state variables by any factor whatsoever comprised within a certain interval.

Figure 6:
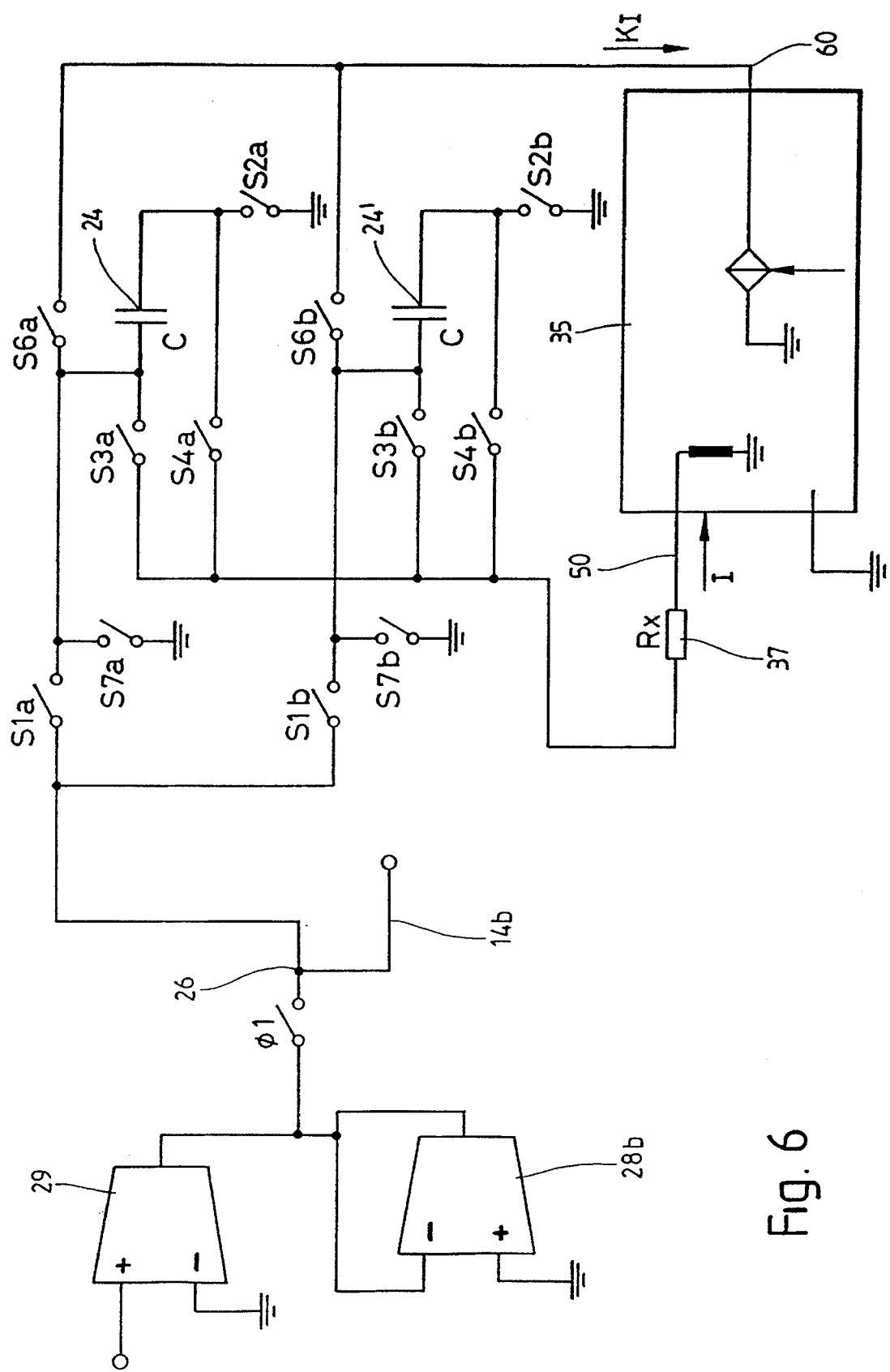
FIG. 6 shows the transient suppressing means which according to a second specific embodiment of the present invention are associated with capacitor 24b of the filter of FIG. 4.

FIG. 6 thus shows a second embodiment of the transient suppression means according to the present invention. In the present example, the transient suppression means are used in order to change the value of the state variable associated with the capacitor 24b of capacity C2 of FIG. 4. The components shown on FIG. 6 which already appear on FIG. 4 bear the same reference numerals.

The circuit of FIG. 6 functions thanks to a block 35 furnishing as output a current the intensity of which is equal to the product of the current intensity at the input by the amplitude of a control signal. Such block 35 is adapted in order, on the one hand, to furnish at its output 60 a current KI which is equal to K times the current I received at its input 50 and, on the other hand, to assure that the input 50 remains at earth. Such block 35 can be formed in a manner presented at ISCAS 1989 by Adel S. Sedra under the title "The Current Conveyor; History And Progress" with the addition of a variable ratio current mirror.

The principle of operation of such transient suppression means is simple. They include two identical capacitors, a first of the two (for example capacitor 24) fulfilling at a given moment the function of the capacitor 24b in the circuit of FIG. 4. When it is desired to modify the value of the state variable by any given factor whatsoever, the first capacitor is discharged through block 35. Block 35 then furnishes as output a current the intensity of which is equal to the intensity of the current produced by the discharge of the first capacitor multiplied by a given factor K. The output current of block 35 is used in order to charge the second capacitor which, at the end of the operation, exhibits between its terminals a voltage equal to the voltage which previously existed between the terminals of the first capacitor multiplied by said given factor. Once this operation is terminated, a switching operation enables coupling capacitor 24' to the circuit in the position which capacitor 24 occupied initially.

In addition to the two identical capacitors references 24 and 24' and block 35, the circuit of FIG. 6 includes a switch 1 which corresponds to the switch 1 of FIG. 5 and a series of switch pairs S1a, S1b, S2a, S2b, S3a, S3b, S4a, S4b, S6a, S6b, S7a and S7b. Capacitor 24 is associated with switches Sa while capacitor 24' is associated with switches Sb. Finally, a resistance 37 is assembled at the input of the multiplier 35 in order to brake the discharge of the capacitor during modification of the value of the state variable.

In the absence of gain charge of the amplification/attenuation stage, switch φ1 is closed. Here we will suppose prior to the gain change it is capacitor 24 which was coupled to the filter. In these conditions, switch S1a is closed and switch S1b is open. Additionally, switches S3a, S4a, S6a and S7a are also open while switch S2a is closed. Note further that the switches S2b and S7b are closed in order to maintain capacitor 24' entirely discharged and that switches S3b, S4b and S6b are open.

At the instant when the gain control means send a control signal in order to modify the gain by a given factor, the sequencer controlling the transient suppression means becomes operative. It generates, on the one hand, a first control signal in order to open switch φ1 and to disconnect capacitor 24 from the rest of the circuit and, on the other hand, it transmits to block 35 a signal corresponding to the given factor by which the gain at the input of the filter is to be modified.

Then switches S4a, S7a, S2b and S6b are closed while switch S2a is open. Under these conditions, capacitor 24 is going to be discharged through resistance 37 in the input of block 35. Additionally, all the current furnished as output of the multiplier 35 is going to be stored in capacitor 24' It will be understood that under these conditions the charge which is going to accumulate in capacitor 24' will be proportional to the charge which capacitor 24 initially contained. Furthermore, the multiplication factor K of block 35 being determined by the factor by which the gain control means modified the gain, the ratio between the charge of capacitor 24' and that of capacitor 24 will be equal to the factor by which the gain is changed.

Once this operation has been accomplished, the sequencer sends a control signal in order to close switch S1b and to close switch φ1 in a manner to connect capacitor 24' with the circuit.

Let us specify finally that with this latter embodiment it is necessary to provide in the logic controlling the transient suppression means a means for memorizing which of the two capacitors 24 and 24' is coupled with the circuit at a given moment. Effectively, the sequence of control signals produced by the sequencer at the moment of a change of gain is not the same according to whether it is the capacitor 24 or the capacitor 24' which is coupled into the circuit.

Although embodiments described above made use of the well-known switched-capacitor technique, it will be understood that other techniques as, for example, switched current techniques could be also used.

Figure 7:
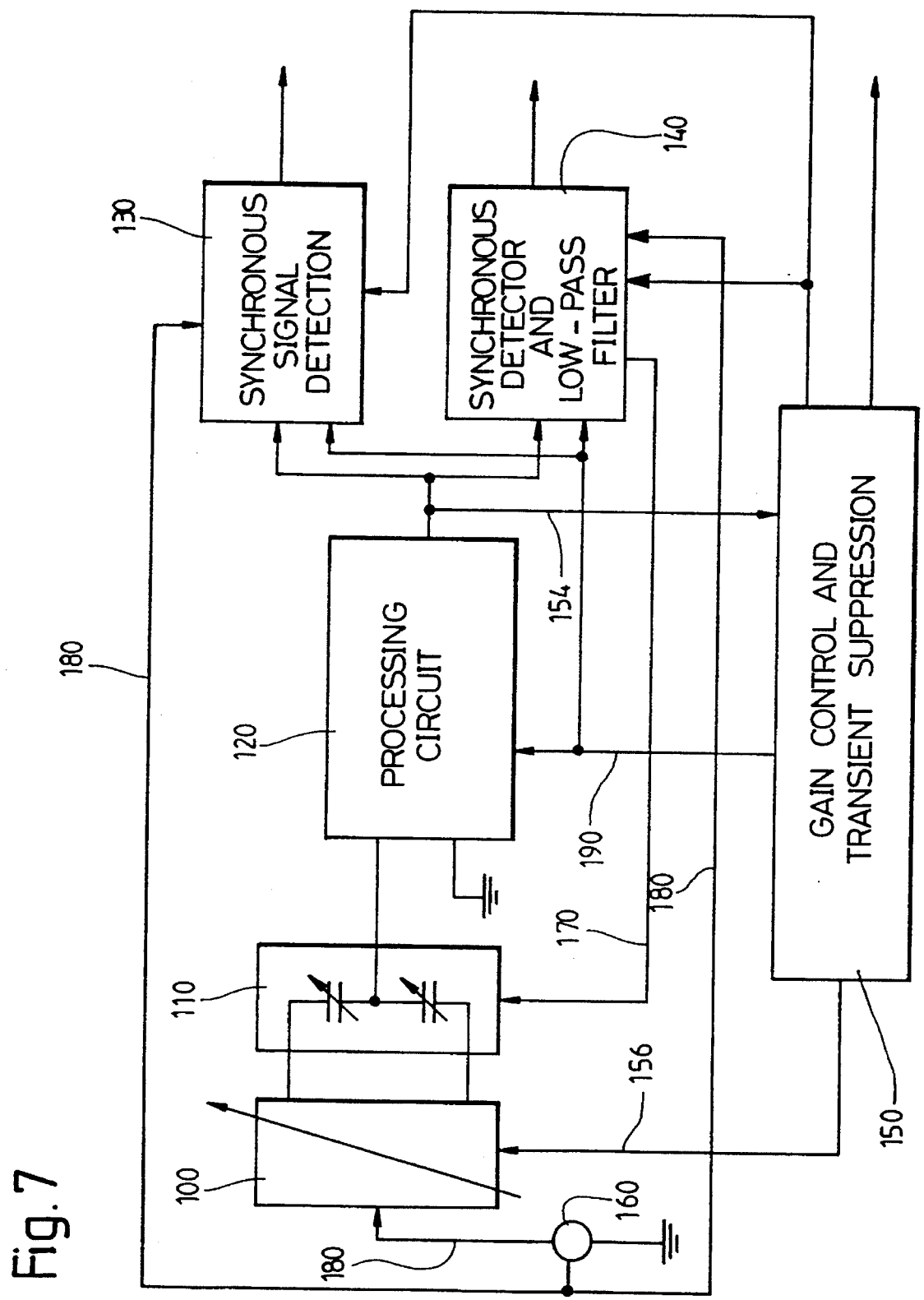
FIG. 7 is the basic schematic of a processing circuit according to the present invention associated with a capacitive pick-up.

FIG. 7 shows another example of application of the present invention. The arrangement shown in a schematic fashion in FIG. 7 is provided in order to furnish as output a signal which is variable in response to a variable quantity which is sensed at the input by a sensor which, in the present example, is of the capacitive type.

In referring to FIG. 7, it is seen that the arrangement includes initially a capacitive sensor with two capacitors 110. The output of sensor 110 is coupled to the input of a processing circuit interface 120 which can be typically constituted by a sigma-delta band-pass modulator. The sigma-delta modulator 120 furnishes a train of bits modulated in pulse density. Such bit train is furnished to a synchronous digital detection module 130 operated by a time base signal furnished by a line 180 from a clock 160. Module 130 furnishes in response a digital signal which constitutes the output signal of the arrangement. The bit train produced by the processing circuit 120 is also furnished to a module 140 which functions basically as a synchronous detector followed by a low-pass filter in order to produce an analog output signal starting from the pulse density modulated signal. In the example shown in FIG. 7, the analog signal produced by the module 140 is further transmitted by a line 170 to the sensor 110 in manner to constitute a feedback loop in order, for example, to maintain the sensor in a balanced state.

The capacitive sensor 110 can, in a known manner, be of the type comprising two capacitors and in which a movable conductive blade constitutes a common movable armature for the two capacitors. With such an arrangement, every displacement of the movable blade is translated by a variation of the respective capacities of the two capacitors. Such capacity variation of the two capacitors is measured typically by placing the respective fixed armatures of the two capacitors at two imposed voltages of the same value but of opposite sign an in measuring either the charge or the potential on the movable blade. It is to be noted that with such an arrangement the intensity of the measuring signal, or otherwise said the sensitivity of the sensor, is proportional to the modulus of the potential imposed on the fixed armatures.

The arrangements corresponding to the part of the functional schematic in FIG. 7 which has been described up until the present can be formed with known elements. A specific example of such an arrangement is the force measuring arrangement described in the patent document EP 0 590 658. However, it could be particularly advantageous to use a modulator such as that described in the article entitled "A Fourth-Order Bandpass sigma-delta Modulator" by Stephen A. Jantzi et al. which appeared in the IEEE Journal of Solid-State Circuits, Vol. 28, Nr. 3, March 1993.

In order to permit use of the arrangement which has just been described in conditions in which the dynamic of sensor 110 is more extensive than the dynamic range associated with the processing circuit 120, it is possible to have recourse to a technique of variation of the sensor sensitivity controlled by the input signal level of the sensor. This technique corresponds entirely to the technique of controlled gain variation described in relationship with the example of FIG. 3. In order to bring about variation of the sensitivity of the capacitive sensor, it is sufficient, in conformity to what has already been said, to vary the voltage imposed on the fixed armatures of the sensor.

To this effect, the arrangement of FIG. 7 further includes a module 150 which fulfils the same functions as the means shown by block 6 on FIG. 3. The module or block 150 checks the output level of the processing circuit 120 with the help of line 154 in a manner to determine at which moment the sensitivity of sensor 110 must be changed. Further to be seen in FIG. 7 is a control line 156 which enables block 150 to control a block 100 which is provided in order to furnish the two reference potentials for the fixed armatures of the capacitive sensor 110.

If the processing circuit 120 includes a memory, the provoked variations of the sensitivity of the sensor, as in the case of the arrangement of FIG. 3, are going to bring about the appearance of transients. According to the present invention, the arrangement of FIG. 7 comprises transient suppression means (symbolized by line 190) which can be formed in a manner entirely analogous to those which have been described in reference to FIG. 5 or to FIG. 6.

Figure 8:
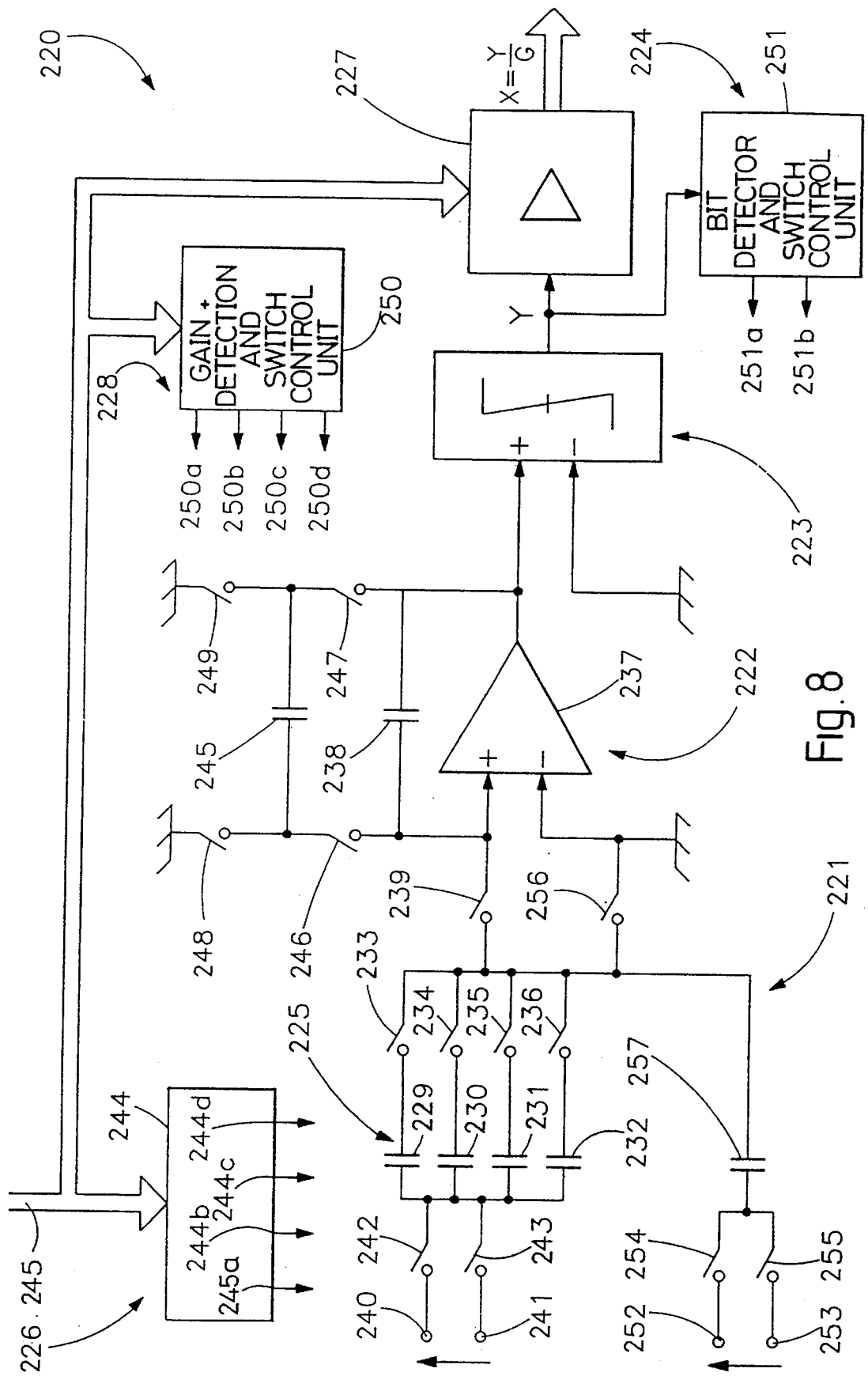
FIG. 8 is a simplified circuit diagram of a sigma-delta analog/digital converter having multiple input ranges according to the present invention.

Referring now to FIG. 8, there is generally shown a multi-range sigma-delta converter 220 having a signal combining means 221, an integrator 222, a comparator 223, feedback means 224, input signal amplifying means 225, range setting means 226, output signal amplifying means 227 and noise compensation means 228. The input signal amplifying means 225 comprises four capacitors 229, 230, 231 and 232. One electrode of the capacitors 229, 230, 231 and 232 is connected respectively to the one side of switches 233, 234, 235 and 236.

The integrator 222 comprises an operational amplifier 237 having a capacitor 238 connected between its inverting input and its output. The integrator 222 produces an analog voltage at its output representative of an integration over time of the charge stored between the electrodes of the capacitors 229 to 232 and 257. The other side of the switches 233, 234, 235 and 236 are connected together to the inverting input of the operational amplifier 237 via a switch 239. Two terminals 240 and 241 are connected to the input signal amplifying means 225, via two switches 242 and 243, in order that an analog voltage Vin present at these terminals is applied across one or more of the capacitors 229, 230, 231 and 232. Preferably, the capacitors 229, 230, 231 and 232 each have the same value Cin.

The range setting means 226 comprises a switch control unit 244 and the switches 233, 234, 235 and 236. A data bus 245 provides a signal indicating the desired input signal gain G of the sigma-delta converter 220 to the switch control unit 244. The switch control unit 244 has four outputs 244a, 244b, 244c and 244d for controlling the operation of the switches 233, 234, 235 and 236 respectively. Based upon the gain signal received from the bus 245, the operation of the switches 233, 234, 235 and 236 are selectively controlled so that any one or combination of the capacitors 229, 230, 231 and 232 are connected in parallel so as to have the input voltage $V_{in}$ between the terminals 240 and 241 applied thereacross. The charge $Q_{in}$ stored between the electrodes of the combination of capacitors connected in parallel may thus be equal to $C_{in}*V_{in}$, $2C_{in}*V_{in}$, $3C_{in}*V_{in}$ or $4C_{in}*V_{in}$, depending on the desired amplification of the input signal.

A further capacitor 245 is connected in parallel with the capacitor 238 via two switches 246 and 247. Both electrodes of the capacitor 45 are also connected to a convenient ground supply via two further switches 248 and 249. The noise compensation means 228 comprises a gain detection and switch control unit 250 for detecting when the gain signal from the bus 245 changes value and controlling, via its outputs 250a, 250b, 250c and 250d, the operation of the switches 246, 247, 248 and 249 respectively, in order that the capacitors 238 and 245 are either connected in parallel with each other or in series between the operational amplifier 237 and ground.

The comparator 223 compares the voltage level at the output of the operational amplifier 237 with a selected reference voltage, in this case the ground supply. Depending upon whether the operational amplifier output voltage is greater or less than zero volts, the comparator produces a bit at its output which has a value of either +1 or −1. In the data bit stream, referenced Y, thus produced by the comparator 223, the density of logically high bits to logically low bits is representative of the analog input voltage $V_{in}$ applied between the terminals 240 and 241.

The feedback means 224 comprises a bit detector and switch control unit 251, two terminals 252 and 253, switches 239, 254, 255 and 256, a capacitor 257 having a value $C_{ref}$ and a voltage source $V_{ref}$ (not shown). The control unit 251 has outputs 251a and 251b for controlling the operation of the switches 254 and 255 respectively. When the switches 254 and 255 are closed, the voltage $V_{ref}$ is applied across the electrodes of the capacitor 257 so as to produce a charge $Q_{ref}$ equal to $C_{ref}*V_{ref}$. Depending upon whether the bit produced at the output of the comparator 223 is +1 or −1, the charge $Q_{ref}$ is integrated either positively or negatively. The difference between the charges $Q_{in} \pm Q_{ref}$ is thus stored between the electrodes of the capacitor 238 and accordingly integrated by the operational amplifier 237.

Finally, the output signal amplifying means 227 comprises a logical unit for multiplying the digital information contained in the bit stream Y produced at the output of the comparator 223 by the inverse of the gain G from the bus 245. The digital word, referenced X, resulting from this calculation is supplied at the output of the logical unit 227.

The stability of the sigma-delta converter 220 is guaranteed as long as the charge $Q_{in}$ associated with the input signal is less than the absolute value of the charge Qref injected by feedback. This condition sets the input range of the sigma-delta converter 220, the maximum allowable voltage of the input signal being given as an absolute value by $V_{inmax}=V_{ref}*(C_{ref}/N*C_{in})$ where N is the number of capacitors across which the input voltage $V_{in}$ is applied for a selected range. The input signal $V_{in}$ may thus be sampled with a gain of 1, 2, 3 or 4, by controlling the switches 233, 234, 235 and 236 so as to select a corresponding number of the capacitors 229, 230, 231 or 232

In this embodiment of the invention, the multiplication of the input signal by a selected gain is achieved by programming the gain of the input branch of the sigma-delta converter. Advantageously, the consumption of the sigma-delta loop in this embodiment is, in a first approximation, independant of the gain selected. The consumption of the converter 220 is directly linked to the charge $Q_{ref}$ injected by feedback, which is independant of the gain selected. Similarly, the deviation of the integrator is also independant of the gain selected and can thus be chosen to be optimal for all input signal ranges of the converter 220.

It will be appreciated that in other embodiments of the invention, the multiplication of the input signal by a desired gain may be otherwise realised, for example, by a programmable current mirror or other circuit in which active elements other than the capacitors 229, 230, 231 and 232 are selected.

It is also to be understood that in other embodiments of the invention, the gain selected may be greater than 1 or less than 1 and may take values other than the positive integers (1, 2, 3 and 4) of FIG. 8. The use of positive integers as values of the gain, however, simplifies the operation of the division performed by the logic unit 227. Preferably, the values of gain selected correspond to the powers of two (i.e. the gain can take such values as 4, 2, 1, ½, ¼ . . . ) so that the division of the digital word produced by the logic unit 227 involves a simple shift of the bits in the word.

The integrator 222 accumulates the difference between the analog input signal and the digital output signal reconverted into analog form. For example, when the input signal range is set to a gain of 1, the voltage $V_{in}$ is applied across only one of the capacitors 229, 230, 231 or 232. The voltage $V_{amp}$ at the output of the operational amplifier 237 is $$V_{amp} = \int t1 \ G*(V_{in}*C_{in} - X*V_{ref}*C_{ref}),$$

where G equals 1, and the difference between the charges $Q_{in}$ and $\pm Q_{ref}$ is stored between the electrodes of the capacitor 238. If the gain is changed from a value of 1 to a value of 2 at a time t1, the voltage $V_{in}$ is also applied across an additional one of the capacitors 229, 230, 231 or 232. The voltage $V_{amp}$ at this moment should be equal to $$\int t1 \ 2(Vin*Cin - X*Vref*Cref).$$

However, the charge stored by the capacitor 238 at this moment is still equal $$\int t1 \ (V_{in}*C_{in} - X*V_{ref}*C_{ref}),$$

thus creating an inconsistency between the signification of the integrator and its contents.

In order to adapt the contents of the integrator 222 to the new range and thus avoid the commutation noise which would otherwise result from this inconsistency, the switch control unit 250 momentarily closes the switches 247 and 248, thereby charging the capacitor 245 to the same extent as the capacitor 238. The switches 247 and 248 are then opened, following which the switches 246 and 249 are closed. The capacitor 245 is thus discharged and its charge is transferred to the electrodes of the capacitor 238. If the value of the capacitor 245 is chosen to be the same as that of the capacitor 245, the charge stored by the integrator 222 thus becomes the equivalent of $$\int t1\ 2(V_{in}*C_{in} - X*V_{ref}*C_{ref})$$

and the error accumulated therein doubled to compensate for the doubling of the selected gain.

We shall now suppose that the gain is to be reduced at time t2 from a value of 2 to a value of 1. Just before the time t2, two of the capacitors 229, 230, 231 or 232 are connected in parallel and the charge stored by the capacitor 238 is equal to $$\int t1\ 2(Vin*Cin \pm X*Vref*Cref).$$

At time t2, the voltage $V_{in}$ applied across only one of these capacitors. The voltage $V_{amp}$ at this moment should be equal to $$\int t1\ (Vin*Cin - X*Vref*Cref).$$

However, the charge stored by the capacitor 38 at this moment is still equal to $2(V_{in}*C_{in}-X*V_{ref}*C_{ref})$. In order to compensate for this inconsistency, the switch control unit 250 firstly discharges the capacitor 245 by momentarily closing the switches 248 and 249. The switches 246 and 247 are then closed so as to connect the capacitor 245 in parallel with the capacitor 238. If the value of the capacitor 245 is chosen to be the same as that of the capacitor 238, the charge stored between the electrodes of the capacitor 238 is thus halved. The capacitor 245 is then disconnected from the integrator 222. The charge stored by the integrator 222 thus becomes the equivalent of $$\int t1\ (V_{in}*C_{in} - X*V_{ref}*C_{ref})$$

and the error accumulated therein halved to compensate for the halving of the selected gain.

The sigma-delta converter of FIG. 8 provides a particular example of the way in which the commutation noise resulting from a change in the signal input range may be compensated for by multiplying the error accumulated in the integrator by a ratio R of the newly selected gain to the previously selected gain. This operation may be more conveniently realised when the relation R between different successive gains is constant, as the only operations required to be performed are a multiplication and a division of the accumulated error by R. In addition, as the use of gains which are the powers of 2 in such converters simplifies the arithmetic operations performed by the logic unit 227, the value of R may conveniently be equal to 2. The use of the capacitors 238 and 245 in FIG. 8 provide a practical example of such a realisation.

Whilst the sigma-delta converter described in relation to FIG. 8 converts an analog input voltage into a digital output word, the sigma-delta converter according Co the present invention is not limited to this application. For example, the invention is applicable to applications in which a capacitance is measured and converted into a variable output signal. In this case, the capacitors 229, 230, 231 and 232 may be replaced by a voltage source having four predetermined values which are applied across the measured capacitance according to the selected gain of the input signal.

The input signal to the sigma-delta converter of the present invention may alternatively be an analog current supplied directly to the integrator 222, the input signal amplifying means in this case comprising an adjustable current amplifier or resistor network. Other variations and possible applications will be evident to one skilled in the art.

Another application of the present invention is illustrated in FIG. 9, which shows generally an oversampled digital/analog converter 270 including a multirange sigma-delta converter 271 for converting a digital quantity of n bits into a digital quantity of m bits. In addition to the sigma-delta converter 271, the oversampled digital/analog converter 270 comprises a digital interpolating filter 272, an elemental digital/analog converter 273 and an analog low-pass filter 274.

An input signal X, consisting of a digital n-bit word, is supplied to the interpolating filter 272. The signal X is firstly interpolated and then sampled at a frequency fs in the interpolating filter 272, where fs is much greater than the Nyquist frequency $f_N$ of the input signal X. As will be subsequently explained, the sigma-delta converter 271 is used as a digital noise-shaper, operating at a clock frequency of $f_s$, which truncates the signal X1 from the interpolating filter into a signal X2 consisting of a digital m-bit word, where n>m. Noise created by the truncation is thereby rejected towards frequencies higher than the sampling frequency $f_s$. The truncated word X2 is converted into an analog signal V1 by the elementary digital/analog converter 273, before being passed through the low-pass filter 274 to eliminate the truncation noise rejected into the higher frequencies.

In order to maximize its resolution over a range of input signals, the oversampled digital/analog converter 270 also comprises a bus 275 for providing the sigma-delta converter 271 and the elementary D/A converter 273 with a selected gain G. In the sigma-delta converter 271, the signal X1 is multiplied by the gain G so that the signal X2 is more closely matched to the input range of the elementary D/A converter 273. Once the signal X2 has been converted into analog form, it is divided by G so that the filtered output signal $V_{out}$ is representative of the digital input signal X.

In order to explain the principle of operation of a digital noise shaper, reference will now be made to figure 10 which shows generally a sigma-delta converter (digital noise-shaper) 280 having an integrator 281, a truncator 282 and a subtraction block 283. The integrator 281 comprises a digital register 284 and an addition block 285. A digital n-bit signal $X_{in}$ is supplied to the converter 280. A digital m-bit signal $Y_{out}$, which will be described shortly, where n>m, is subtracted from the signal $X_{in}$ and the resultant n-bit signal $X_{diff}$ supplied to the integrator 281. The integration is performed therein according to an algorithm which adds the output of the register 284 from a previous clock cycle to the signal $X_{diff}$ and temporarily stores the resultant sum in the register during a present clock cycle. The n-bit signal $X_{int}$ from the integrator 281 is truncated into an output signal $Y_{out}$ comprising the m most-significant-bits of the signal $X_{int}$. The signal Your also provides the feedback signal which is subtracted from the input signal $X_{in}$ by the subtraction block 283.

Figure 1:
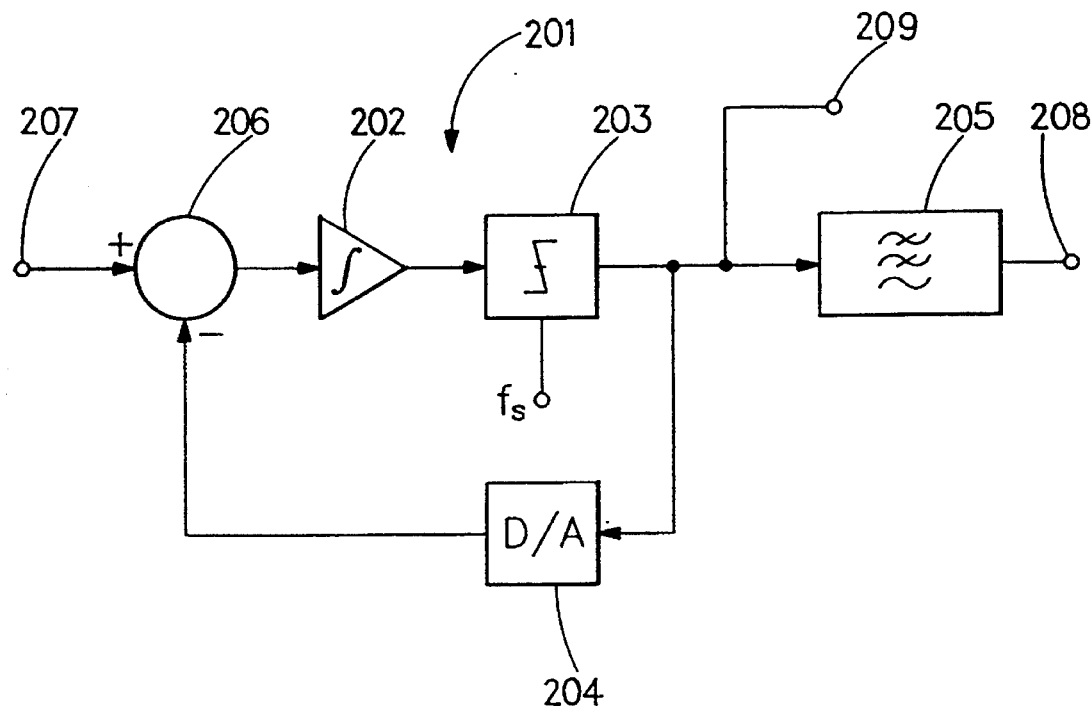
Figure 2:
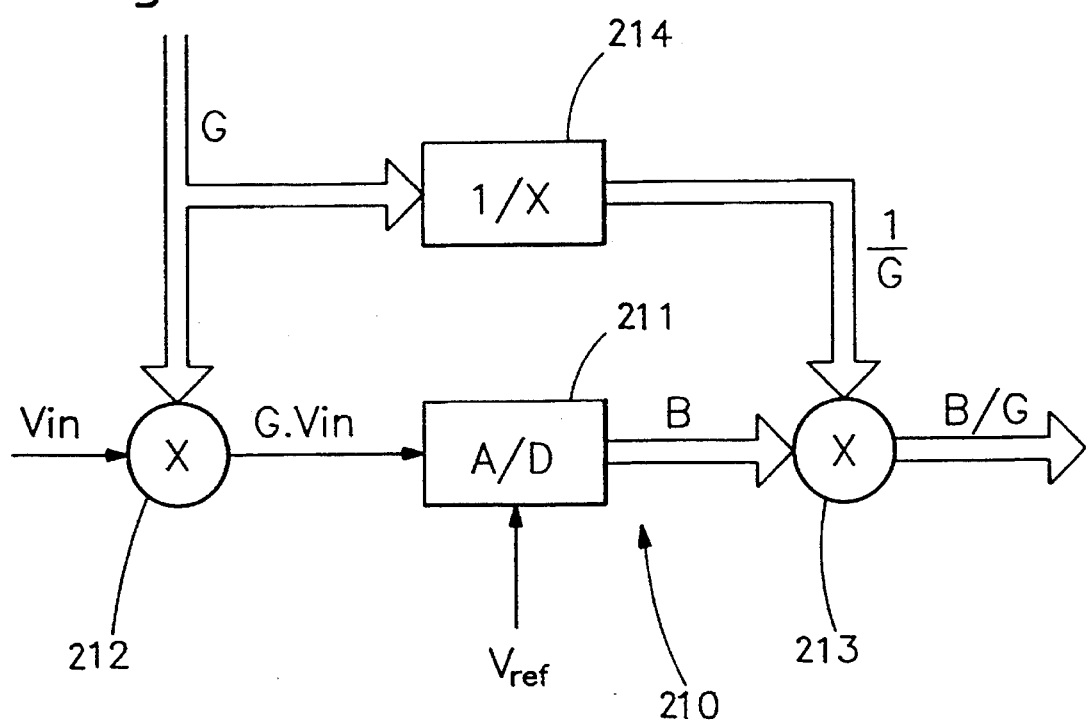

By comparing the sigma-delta converter of FIG. 1 with the digital noise-shaper of FIG. 10, it can be seen that the analog input signal is replaced by a digital signal having n-bits, the integrator 22 is replaced by the purely digital integrator 281 and the comparator 23 is replaced by the truncator 282. The output of the D/A converter 24 is replaced by the signal $Y_{out}$, the production of which does not require a physical circuit due to the division of the bus Xint into two parts by the truncator 282. Finally, the signal combining unit 26 is replaced by the subtraction block 283.

It can thus be seen that the digital noise-shaper 280 of FIG. 10 is functionally equivalent of the sigma-delta converter 21 of FIG. 1. In that regard, the digital noise-shaper 280 interpolates and oversamples the n-bit signal $X_{in}$ so as to produce an output signal $Y_{out}$ providing an m-bit estimation of the input signal $X_{in}$. The quantisation error resulting from this sampling process is rejected towards the higher frequencies by the integrator used to perform the sigma-delta conversion.

In FIG. 10, the m most-significant bits $Y_{msb}$ of the signal $X_{int}$ are subtracted from the n-bit input signal $X_{in}$ by the subtraction block 283, the integrator 281 then adding $X_{int}$ to the resultant signal. This is equivalent to direct addition of the (n-m) least-significant-bits $Y_{lsb}$ of the signal $X_{int}$ to the signal $X_{in}$. FIG. 11 shows a digital noise-shaper 290 wherein this simplification has been made. The digital noise-shaper 290 comprises the digital register 284, truncator 282 and addition block 285 of FIG. 10, however in this embodiment of the present invention, the least-significant-bits $Y_{lsb}$ are accumulated until they produce an overflow into the signal $Y_{msb}$ and are thus transferred to the output of the truncator $Y_{out}$.

As is the case with the sigma-delta converter 220 shown in FIG. 8, the sigma-delta converter 290 thus memorizes the conversion error between its input signal and its output signal. In an application requiring multiple input signal ranges, a change in the gain of the input signal creates an inconsistency between the signification of the integrator and its contents which can be avoided by the multiplication of the conversion error by the ratio of new gain to the old gain.

FIG. 12 shows an embodiment of the multi-range sigma-delta converter 271 of FIG. 9, comprising the converter 290 of FIG. 11 and two multiplication blocks 291 and 292. The multiplication block 291 multiplies the input signal $X_{in}$ by the selected gain signal G(k) from the bus 275. The value of the gain G(k) may be altered depending on the chosen input signal range of the converter 271. As the error between the input signal Xin and the output signal $Y_{out}$ is accumulated in the digital accumulator 284 with a gain depending upon the range selected, changing the input signal range introduces commutation noise into the stored conversion error. In order to avoid this commutation noise, the multiplication block 292 is placed in the feedback path between the truncator 282 and the addition block 285, in order to multiply the signal $Y_{lsb}$ by the ratio of the new gain G(k) to the old gain G(k–1).

Whilst not essential to the invention, the realisation of this multiplication is simplified if the values of the gain are limited to the powers of 2. In this case, the position of the bits in each of the digital words $X_{in}$ and $Y_{lsb}$ may be shifted an appropriate number of places. Conveniently, this may be carried out by the use of shift registers, the gain signals G(k) and G(k)/G(k–1) determining the extent to which the positions of the bits are shifted.

A further embodiment of the present invention will now be described with reference to FIG. 13, which shows generally a sigma-delta A/D converter 300 having the integrating means 222, comparator 223 and output signal amplifying means 227 of the sigma-delta converter 220. The operation of these components has already been described in relation to FIG. 8. Additionally, the sigma-delta converter 300 comprises signal combining means 301, feedback signal amplifying means 302, range setting means 303 and feedback means 304.

The feedback signal amplifying means 302 comprises four capacitors 305, 306, 307 and 308. One electrode of the capacitors 305, 306, 307 and 308 is connected respectively to one side of switches 309, 310, 311 and 312. The other sides of the switches 309, 310, 311 and 312 are connected together to the non-inverting input of the operational amplifier 237 via the switch 256. The voltage $V_{ref}$ present at the terminals 252 and 253 is applied across one or more of the capacitors 305, 306, 307 and 308. Preferably, the capacitors 305, 306, 307 and 308 each have the same value $C_{ref}$.

The range setting means 303 comprises a switch control unit 313 and the switches 309, 310, 311 and 312. The switch control unit 313 has four outputs 313a, 313b, 313c and 313d for controlling the operation of the switches 309, 310, 311 and 312 respectively. Based upon the gain signal from the bus 245, the operation of the switches are selectively controlled so that any one or combination of the capacitors 305, 306, 307 and 308 are connected in parallel so as to have the voltage $V_{ref}$ applied thereacross. The charge stored between the electrodes of the capacitors connected in parallel may thus be equal to $C_{ref}*V_{ref}$, $2C_{ref}*V_{ref}$, $3C_{ref}*V_{ref}$ or $4C_{ref}*V_{ref}$, depending upon the gain present on the bus 245.

The input signal $V_{in}$ present between the terminals 240 and 241 is applied, by means of the switches 242 and 243, across a capacitor 314 having a value $C_{in}$. A charge $Q_{in}$ equal to $V_{in}*C_{in}$ is thus produced between the electrodes of the capacitor $C_{in}$. This charge is applied to the inverting input of the operational amplifier 237 via the switch 239.

The feedback means 304 comprises a control unit 315, the terminals 252 and 253, the switches 239, 254, 255, and 256 and the voltage source $V_{ref}$. The control unit 315 detects the digital word at the output of the output signal amplifying means 227, which results from the multiplication of the digital information in the bit stream from the comparator 223 by the inverse of the gain on the bus 245. The control unit 315 has outputs 315a and 315b for controlling the operation of the switches 254 and 255 respectively.

Depending on whether the bit produced at the output of the comparator 223 is +1 or –1, and the desired gain G, the charge $G*Q_{ref}$ is integrated either positively or negatively by controlling the operation of the switches 254 and 255. The difference between the charges $Q_{in} \pm G*Q_{ref}$ is stored between the electrodes of the capacitor 238 and thus integrated by the operational amplifier 237.

As described previously in relation to FIG. 8, the sigma-delta converter 300 is stable as long as the charge $Q_{in}$ is less than the absolute value of the feedback charge $Q_{ref}$. The maximum allowable voltage of the input signal $V_{in}$, as an absolute value, is given by $V_{inmax} = V_{ref}*(N*C_{ref}/C_{in})$, where N is the number of capacitors across which the feedback voltage $V_{ref}$ is applied. The input signal range for the input signal $V_{in}$ may thus be selected according to the number N of the capacitors 305, 306, 307 and 308 connected in parallel.

As described previously, the capacitor 238 of the integrator 222 accumulates the difference between the analog input signal and the digital output signal reconverted into analog form. Commutation noise was introduced into the sigma-delta converter 220 shown in FIG. 8 at the moment that the input signal range was changed, due to an inconsistency between the gain of the input signal $V_{in}$ and the quantification error stored by the capacitor 238. This noise was avoided by the multiplication of the stored quantification error by the ratio of the new gain to the old gain.

In the embodiment of the invention shown in FIG. 8, however, the integrator 222 accumulates the quantification error independently of the gain selected. As the selection of the input signal range is achieved by programming the gain of the feedback branch of the sigma-delta converter 300, rather than its input branch, the output $V_{amp}$ of the operational amplifier 222 is equal to $A(\int^{t_1} e(t).dt)$ where A represents the fixed gain of the input signal $V_{in}$. Any inconsistency between the gain of the input signal and the accumulated error in the integrator of the sigma-delta converter, and hence any resultant commutation noise, is thereby avoided.

Figure 13:
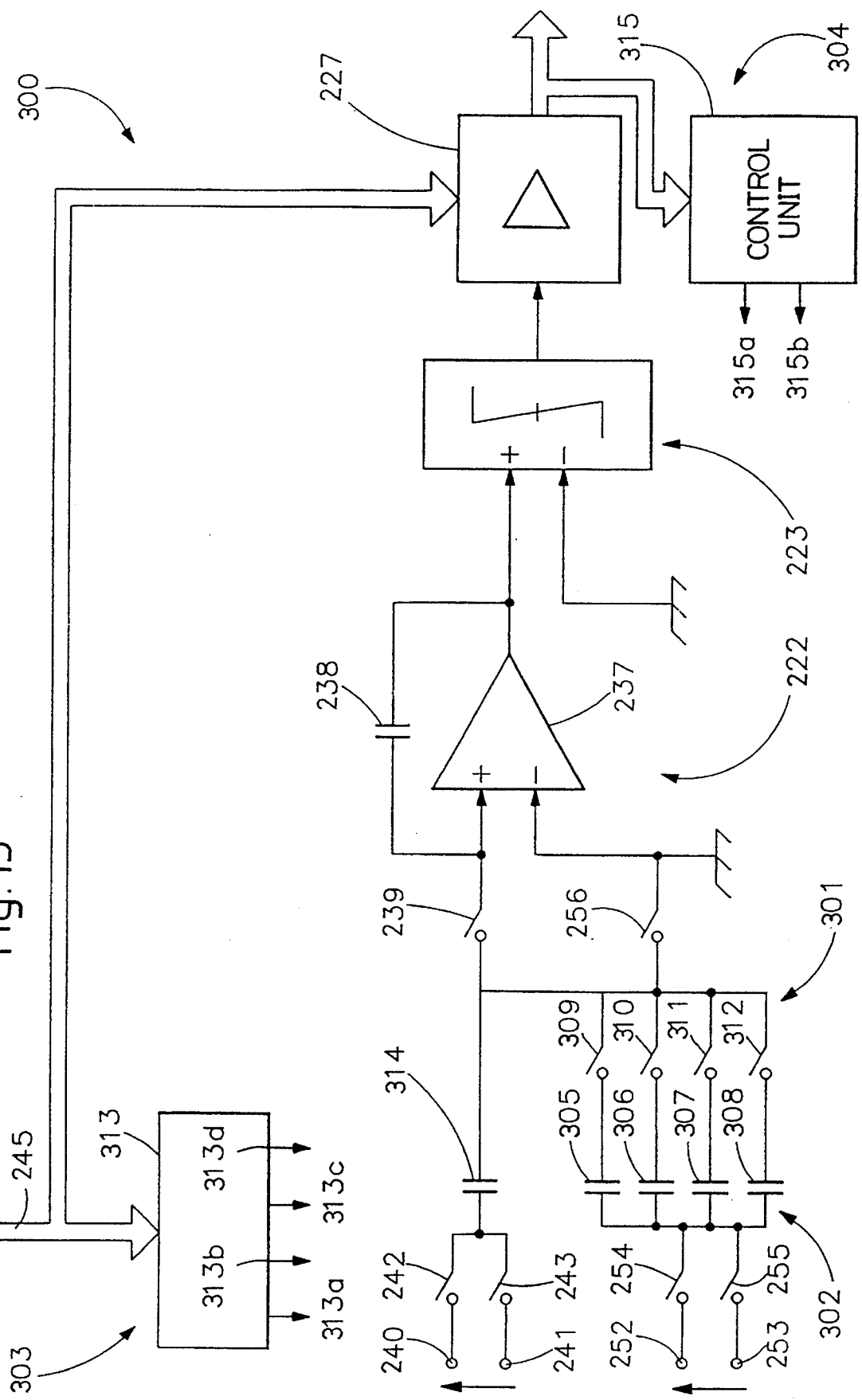
FIG. 13 is a simplified circuit diagram of another sigma-delta analog/digital converter having multiple input ranges according to the present invention.

The sigma-delta converter 300 of FIG. 13 may also be realised in the form of a digital noise-shaper for converting a digital signal of n-bits into a digital signal of m-bits. FIG. 14 shows generally such a sigma-delta converter 320 having the digital accumulator 284 and the addition block 285 of FIG. 12, and additionally a programmable truncator 321. The number of bits in the signal $Y_{lsb}$, and accordingly in its complementary signal $Y_{msb}$, is varied by the truncator 321 in response to the value of the selected gain G provided thereto, thereby permitting the programming of the feedback branch of the converter 321. When the input signal level is weak, the sensitivity of the converter 321 can be increased by reducing the number of least-significant-bits accumulated, and hence more quickly producing an overflow of these bits into the most-significant-bits of the signal X1. As the accumulator always accumulates the difference between the input signal $X_{in}$ and the output signal $Y_{out}$ independently of the range selected for the converter 320, the digital value stored in the accumulator 284 does not need to be updated when the selected range is changed.

It can be seen that sigma-delta converter 320 of FIG. 14 has the advantage of being simpler to realise when compared to the sigma-delta converter 271 shown in FIG. 12.

Figure 15:
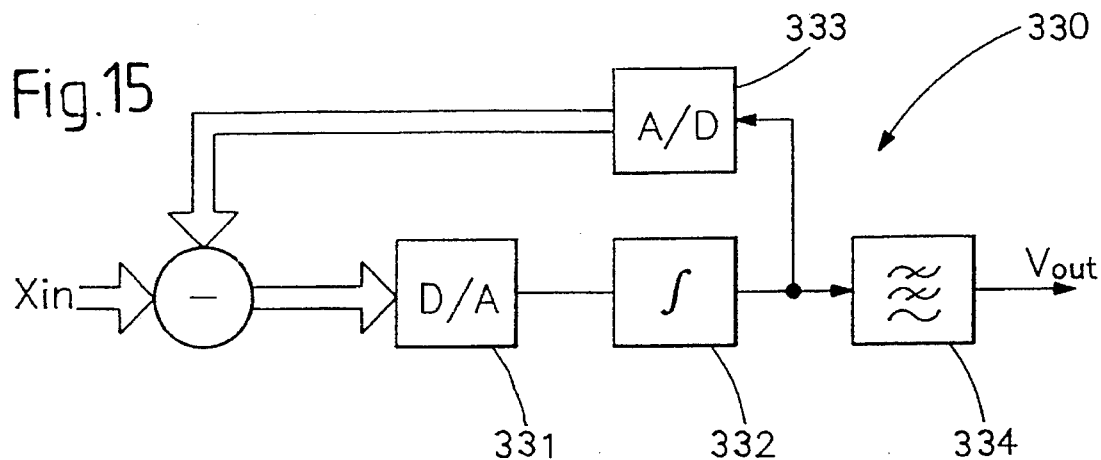
FIG. 15 is a schematic block diagram of a closed-loop oversampled digital/analog converter comprising a sigma-delta converter according to the present invention.

Another application of the sigma-delta converter of the present invention is provided by FIG. 15, which shows generally an oversampled digital/analog converter 330 in a closed loop. The oversampled D/A converter 330 has a direct branch, comprising an elementary D/A converter 331 and an integrator block 332, and a feedback branch comprising an analog/digital converter 333. A low-pass filter 334 filters out high frequency noise from the voltage at the output of the integrator 332. As in all servo systems, the precision of the sigma-delta converter 330 is essentially determined by its feedback branch. The sigma-delta converter 330 may thus be realised using a precise A/D converter 333 and a more elementary D/A converter 331. In multi-ranging applications, the sigma-delta converter of the present invention, for example as described in relation to FIGS. 8 and 13, is therefore ideally suited for use as the A/D converter 333.

In order that the sigma-delta converter of the present invention has the best signal-to-noise ratio, it is preferrable that the gain selected is optimized. If the selected gain is too great, the converter will saturate when either the input signal or feedback signal passes a certain amplitude. This results in the "clipping" of the signal and produces distortion in the output signal. On the other hand, if the selected gain is too low, the converter functions has poor resolution and the signal-to-noise ratio is reduced.

Figure 16:
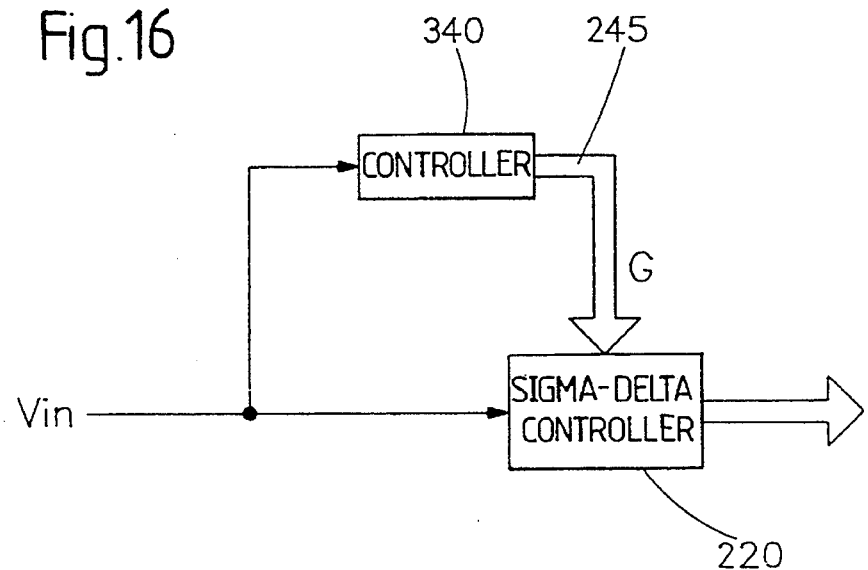
FIG. 16 is a schematic block diagram of a gain control system for use with a sigma-delta converter according to the present invention.

FIG. 16 shows schematically the sigma-delta converter 220 of FIG. 8 and a gain controller 340, although the same principles may be applied to the realisation of a gain controller for use with other embodiments of the present invention. The gain controller 340 measures the amplitude of the signal Vin, but may alternatively measure its energy. According to this measured amplitude, the controller 340 increases or decreases the value of gain G on the bus 245 for use by the sigma-delta controller 220 in setting its input signal range. The controller 340 will not be described in detail, as it may be easily realised by one skilled in the art, but may be comprise, for example, a mixed analog/digital circuit having threshold detectors, comparators, Schmitt triggers, low-pass filters and/or low resolution A/D converters, such a circuit verifying the input signal level and consequently adjusting the sensitivity of the converter 220 by sending a signal representative of the selected range to the range selection means of the converter 220.

Figure 17:
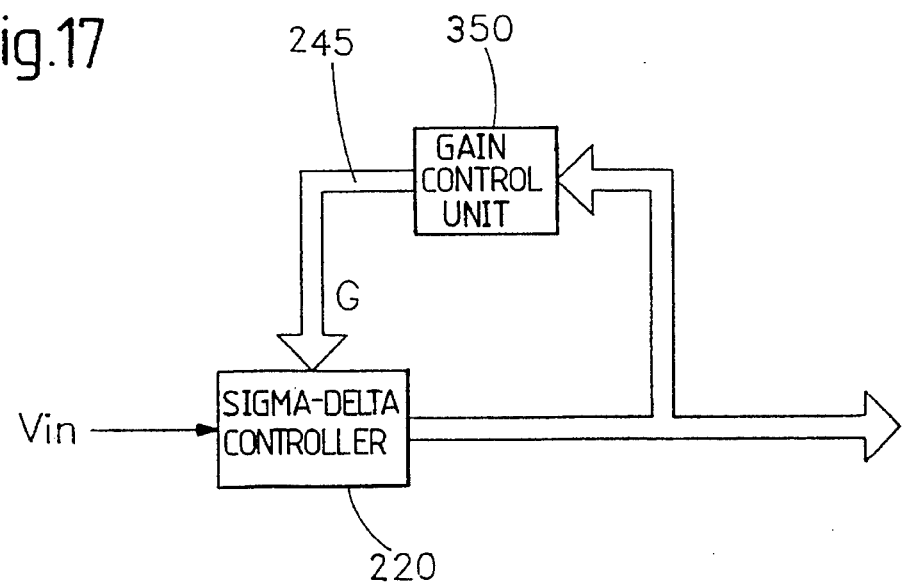
FIG. 17 is a schematic block diagram of an automatic gain control system for use with a sigma-delta converter according to the present invention.

FIG. 17 shows an alternative arrangement wherein the sigma-delta converter 220 of FIG. 8 is controlled by a gain control unit 350 which measures the signal level at the output of the converter 220. As the required circuitry is almost entirely digital, the gain controller 220 thus avoids the use of the additional analog circuitry of the gain controller 340 in FIG. 16.

Finally, the person skilled in the art will understand that the field of application of the present invention is not limited to circuits including a variable gain input stage, but extends generally to all arrangements in which the amplitude of a sensed input quantity can vary in a foreseeable manner and the variation of which has an effect comparable to a change of gain. In a general manner, it can also be said that the invention remains applicable when the amplitude of the signal undergoes foreseeable or detectable changes which are comparable to a gain change following a disturbance, change of characteristics of the processing circuits, etc.

We claim:

1. Processing circuit (2, 120) for producing a variable output signal in response to a variable quantity picked up or received as input, said processing circuit being associated with a stage or having an input sensor (4, 100) furnishing a signal with a variable amplification/attenuation factor and said processing circuit further exhibiting response characteristics which depend in particular from a state variable of at least one circuit element of said processing circuit, characterized in that it includes means (FIG. 5, FIG. 6) for suppressing transients normally produced by modification of said amplification/attenuation factor, said means for suppressing transients functioning by modifying the value of said state variable of said circuit element in direct proportion to said modification of the amplification/attenuation factor.

2. Processing circuit according to claim 1, characterized in that said circuit is a filter.

3. Processing circuit according to claim 1, characterized in that said circuit is a sigma-delta band pass modulator.

4. Processing circuit according to claim 1, characterized in that said means for suppressing transients comprise a switched capacitor circuit element controlled by a sequencer.

5. Processing circuit according to claim 1, characterized in that said means for suppressing transients comprise a multiplier provided for multiplying a current by the intensity of a signal corresponding to the factor by which the gain of said input stage is modified.

6. Processing circuit according to claim 1, characterized in that the means for suppressing transients (FIG. 3) are provided to modify the values of the state variables in predetermined relationships.

7. Processing circuit according to claim 1, characterized in that the means for suppressing transients (FIG. 4) are provided to change the state variables by an arbitrary factor.

8. Processing circuit for an analog signal provided to produce a variable output signal in response to a variable input signal, including an input stage with variable gain amplification/attenuation, the response characteristics of said circuit depending from a state variable of at least one circuit element of said processing circuit among others, characterized in that in includes means for suppressing transients normally produced by a modification of the gain of said input stage, said means for suppression of the transients functioning by modifying the value of said state variable of said circuit element as a direct proportion of said modification of the gain.

9. Processing circuit according to claim 1, characterized in that it is a sigma-delta converter for converting a variable input signal into said variable output signal, comprising signal combining means (221) for adding or subtracting said output signal from said input signal so as to produce a combined signal, integrating means (222) for integrating said combined signal so as to produce an integrated signal, said integrating means having error storage means (238) for storing a quantity representative of the temporal value of said combined signal, comparator means (223) for comparing said integrated signal to one or more pre-defined levels so as to produce said output signal, feedback means (224) for supplying a feedback signal representative of said output signal to said combining means, range setting means (226) for altering said amplification/attenuation factor between a first value and at least a second value, means (27) to amplify said output signal by the inverse of said amplification/attenuation factor, and noise compensation means (28) for multiplying said stored quantity by the ratio of said second value to said first value when said amplification/attenuation factor is changed from said first value to said second value.

10. Processing circuit according to claim 9, characterized in that said integrating means (222) comprises an amplifier (237) having an inverting input, a non-inverting input and an output, and said error storage means (238) comprises a storage capacitance connected between said inverting input and said amplifier output, said storage capacitance (238) storing a charge proportional to said temporal value of said difference signal.

11. Processing circuit according to claim 10, characterized in that said noise compensation means (228) comprises means for multiplying the value of said storage capacitance, and thus said quantity of stored charge, by said ratio.

12. Processing circuit according to claim 10, characterized in that said noise compensation means (228) comprises at least one additional capacitance (245) connectable either in series with said storage capacitance (238), or in parallel with said storage capacitance (238).

13. Processing circuit according to claim 12, characterized in that said storage capacitance (238) and said additional capacitance (245) have the same value.

14. Processing circuit according to any one of the claim 9, characterized in that said input signal comprises an analog voltage, said input signal amplifying means (225) comprising an input capacitance (229,230,231,232), connected to said integrating means (222), for converting said analog voltage into a charge representative of said amplified input signal, said range setting means (226) comprising means (233, 234,235,236) to alter the value of said input capacitance.

15. Processing circuit according to claim 14, characterized in that said input signal amplifying means (225) comprises a plurality of capacitive elements (229,230,231,232), said range setting means (226) comprising switching means (229,230,231,232) for connecting one or more of said capacitive elements in parallel.

16. Processing circuit according to claim 15, characterized in that said capacitive elements (29,30,31,32) have the same value.

17. Processing circuit according to claim 9, characterized in that said input signal comprises a measurable capacitance connectable to said integrating means (222), said input signal amplifying means comprising an preselected input voltage applied across said measurable capacitance for converting said measurable capacitance into a charge representative thereof, said range setting means (226) comprising means to alter the value of said input voltage.

18. Processing circuit according to claim 9, characterized in that said input signal comprises an analog current supplied to said integrating means (222), said input signal amplifying means (225) comprising amplifier means to amplify said analog current, said range setting means (226) comprising means to alter the amplification of said amplifier means.

19. Processing circuit according to claim 9, characterized in that said input signal is variable digital quantity, said integrating means (281) comprising a digital accumulator (284) for storing a digital value of n bits representative of said temporal value of said combined signal, said digital accumulator (284) having an input and an output, and means (285) for adding the digital value from said accumulator (284) output to said combined signal.

20. Processing circuit according to claim 19, characterized in that said noise compensation means comprises means (292) for altering said digital value stored in said accumulator.

21. Processing circuit according to claim 20, characterized in that said comparator means comprises a truncator (282) for separating said digital value into its m most-significant-bits ($Y_{msb}$) and its (n-m) least-significant-bits ($Y_{lsb}$), said output signal ($Y_{out}$) comprising said m most significant bits.

22. Processing circuit according to claim 21, characterized in that said (n-m) least-significant-bits are added to said combined signal so as to provide said accumulator input signal, said accumulator output being supplied directly to said truncator, said noise compensating means multiplying said (n-m) least-significant-bits by said ratio.

23. Processing circuit according to claim 22, characterized in that said ratio equals a power of 2, said noise compensating means comprising means for shifting said (n-m) least-significant-bits to more significant positions in said digital value.

24. Processing circuit according to claim 1, characterized in that it is a sigma-delta converter for converting a variable input signal into a variable output signal, comprising signal combining means (301) for adding or subtracting a feedback signal representative of said output signal from said input signal so as to produce a combined signal, integrating means (222) for integrating said combined signal so as to produce an integrated signal, said integrating means having error storage means (238) for storing a quantity representative of the temporal value of said combined signal, comparator means (222) for comparing said integrated signal to one or more pre-defined levels so as to produce said output signal, means (302) to amplify said output signal by said amplification/attenuation factor so as to provide said feedback signal, and range setting means (303) for altering said amplification/attenuation factor between a first value and at least a second value.

25. Processing circuit according to claim 24, characterized in that said output signal amplifying means (302) comprises a feedback capacitance (305,306,307,308), connected to said integrating means, for converting said output signal into a charge representative thereof, said range setting means comprising means (309,310,311,312) to alter the value of said feedback capacitance.

26. Processing circuit according to claim 25, characterized in that said output signal amplifying means (302) comprises a plurality of capacitive elements (305,306,307,308), said range setting means (303) comprises switching means (309,310,311,312) for connecting one or more of said capacitive elements in parallel.

27. Processing circuit according to claim 26, characterized in that said capacitive elements (305,306,307,308) have the same value.

28. Processing circuit according to claim 24, characterized in that said input signal is variable digital quantity, said integrating means (281) comprises a digital accumulator (284) for storing a digital value of n bits representative of said temporal value of said combined signal, said digital accumulator (284) having an input and an output, said comparator means comprising a truncator (321) for separating said digital value into its m most-significant-bits and its (n-m) least-significant-bits.

29. Processing circuit according to claim 28, characterized in that a number of said (n-m) least-significant-bits are added to said difference signal so as to provide said accumulator input signal, said accumulator output being supplied directly to said truncator (321), wherein said range selection means alters the number of said bits added to said difference signal.

30. Processing circuit according to claim 9, characterized in that it further comprises first gain control means (340) for measuring said input signal and producing a gain signal (G) representative of said amplification/attenuation factor for use by said range setting means (226).

31. Processing circuit according to claims 9, characterized in that it further comprises second gain control means (350) for measuring said output signal and producing a gain signal (G) representative of said amplification/attenuation factor for use by said range setting means (226).

32. Oversampled digital/analog converter (270) including a processing circuit according to claim 9, characterized in that it further comprises an interpolating filter (272) for sampling a digital input signal so as to supply a sampled signal of n bits, an elementary digital/analog converter (273) for supplying an analog signal representative of said digital input signal, said sigma-delta converter (271) receiving said n bits of sampled signal and supplying a noise-shaped signal of m bits representative of said sampled signal to said elementary digital/analog converter (273).

33. Oversampled digital/analog converter (330) including a processing circuit according to claims 9, characterized in that it further comprises an input branch having a digital/analog converter (331) for converting a digital difference signal into an analog difference signal, and an integrator (332) for integrating said analog difference signal so as to produce an analog output signal, a feedback branch having an sigma-delta analog/digital converter (333) for converting said analog output signal into a digital feedback signal, and signal combining means for combining an analog input signal with said feedback signal so as to produce said combined signal.

* * * * *